(12) United States Patent
Shao et al.

(10) Patent No.: US 12,426,236 B2
(45) Date of Patent: Sep. 23, 2025

(54) SEMICONDUCTOR STRUCTURE, METHOD FOR MANUFACTURING SAME AND MEMORY

(71) Applicant: CHANGXIN MEMORY TECHNOLOGIES, INC., Anhui (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 486 days.

(21) Appl. No.: 17/954,467

(22) Filed: Sep. 28, 2022

(65) Prior Publication Data

US 2023/0014259 A1 Jan. 19, 2023

(30) Foreign Application Priority Data

Jul. 21, 2022 (CN) .......................... 202210869849.7

(51) Int. Cl.
  *H10B 12/00* (2023.01)
  *G11C 5/06* (2006.01)
(52) U.S. Cl.
  CPC ............. *H10B 12/05* (2023.02); *G11C 5/063* (2013.01); *H10B 12/33* (2023.02); *H10B 12/482* (2023.02)
(58) Field of Classification Search
  CPC ............. G11C 5/063; H01L 21/76895; H01L 23/5386; H10B 12/05; H10B 12/30; H10B 12/33; H10B 12/34; H10B 12/48; H10B 12/482
  See application file for complete search history.

(56) References Cited

U.S. PATENT DOCUMENTS

| 2003/0017669 A1* | 1/2003 | Kiyotoshi | ............ H10B 12/033 |
| | | | 438/243 |
| 2011/0284939 A1* | 11/2011 | Chung | ................ H10B 12/053 |
| | | | 257/296 |

FOREIGN PATENT DOCUMENTS

CN 111211170 5/2020

OTHER PUBLICATIONS

Zhenguo Qi, "Metallization (5)", Jul. 17, 2019. (http://kb.findrf.com/2019/07/17/金属化（五）/?version=2.5.40003.155&platform=win), 8 pages.

* cited by examiner

*Primary Examiner* — Britt D Hanley
*Assistant Examiner* — Kevin Quinto
(74) *Attorney, Agent, or Firm* — SYNCODA LLC; Feng Ma

(57) ABSTRACT

Embodiments of the disclosure provide a semiconductor structure, a method for manufacturing the same and a memory. The semiconductor structure includes a plurality of active pillars and a plurality of conductor lines. Each of the conductor lines includes a plurality of metal layers located in a gap between two adjacent active pillars and a metal compound layer partially surrounding the plurality of active pillars.

6 Claims, 18 Drawing Sheets

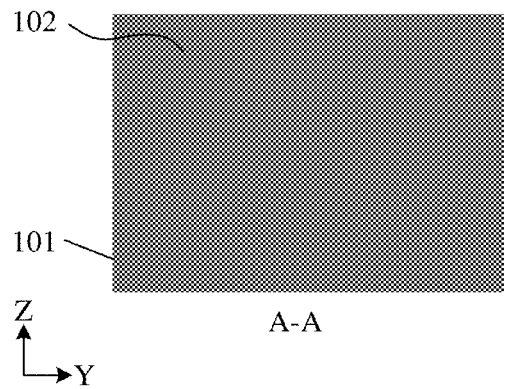 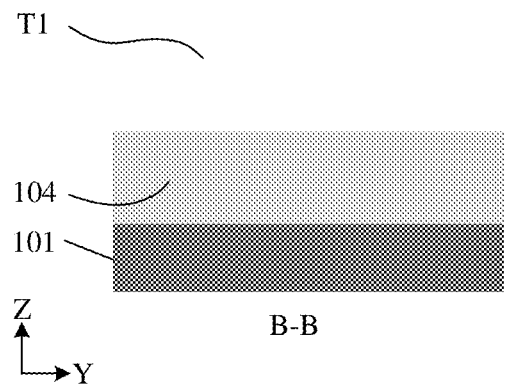
FIG. 5A  FIG. 5B
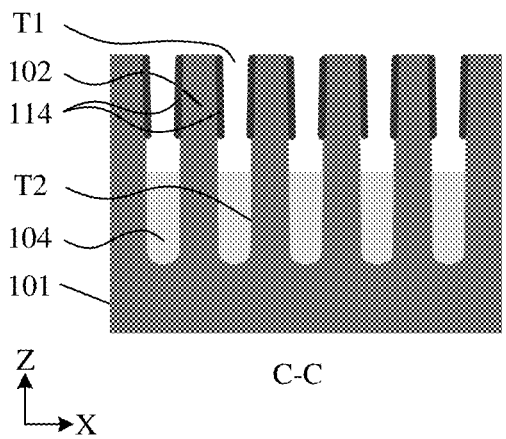 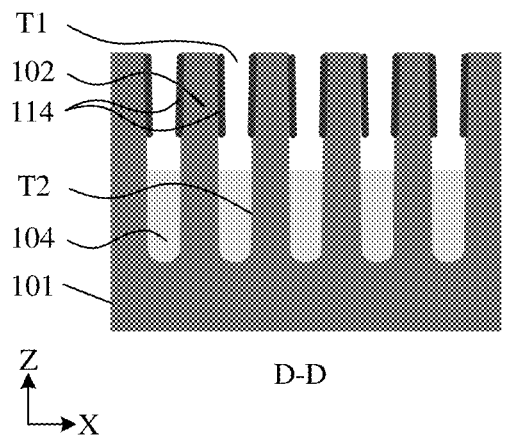
FIG. 5C  FIG. 5D

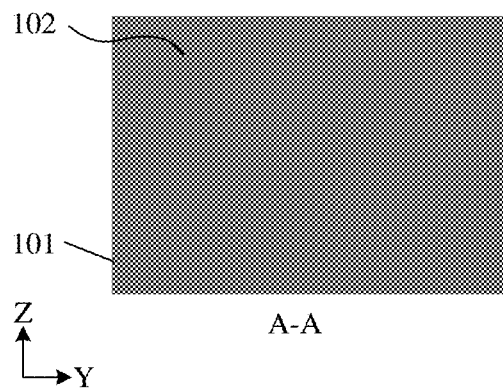
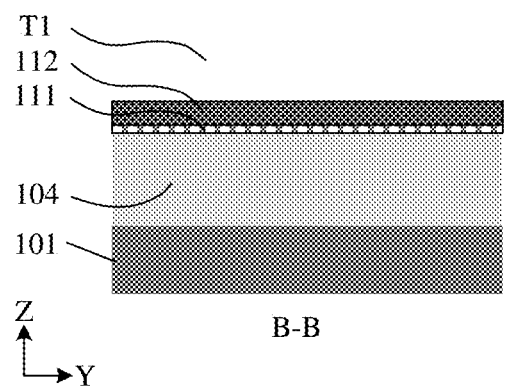
FIG. 6A          FIG. 6B
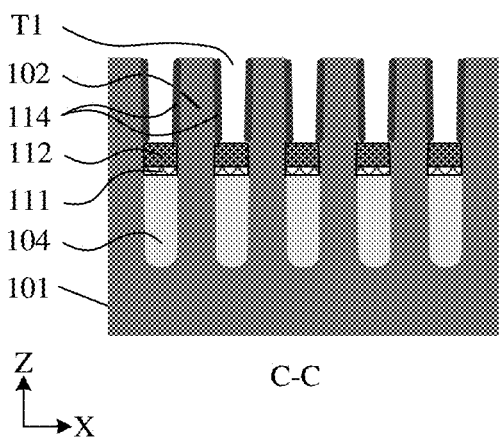
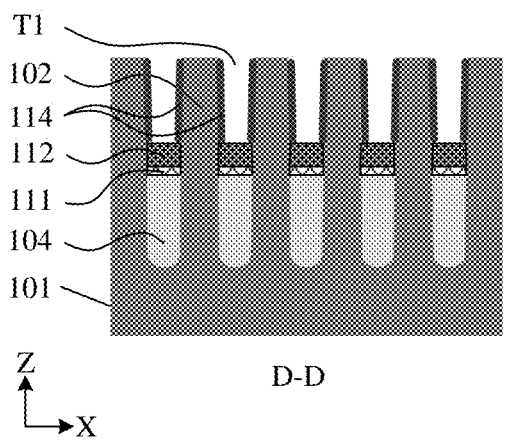
FIG. 6C          FIG. 6D

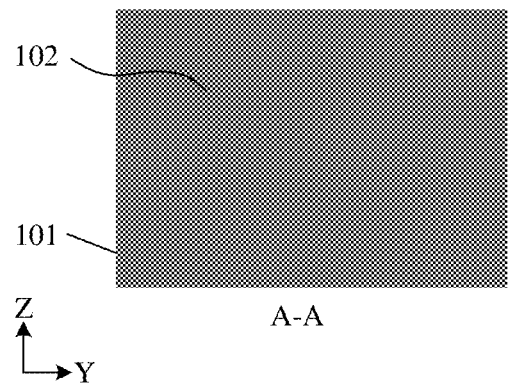
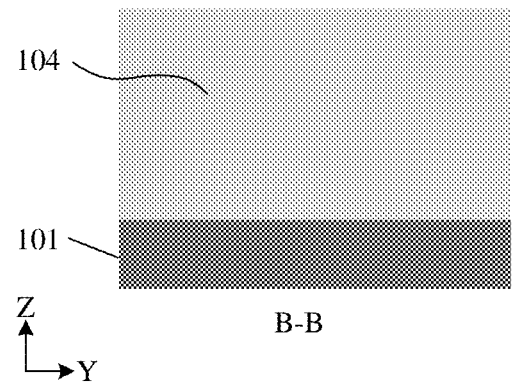
FIG. 9A     FIG. 9B
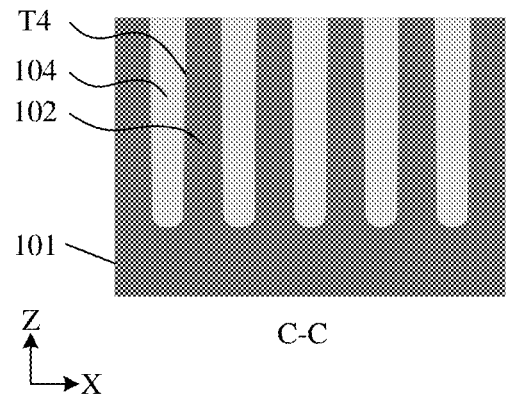
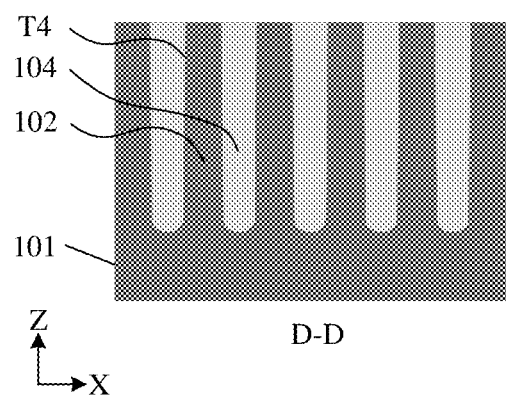
FIG. 9C     FIG. 9D

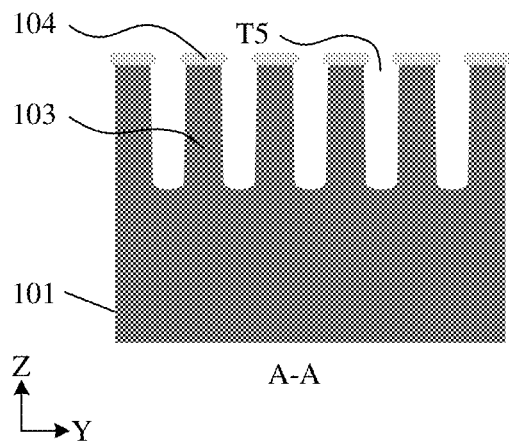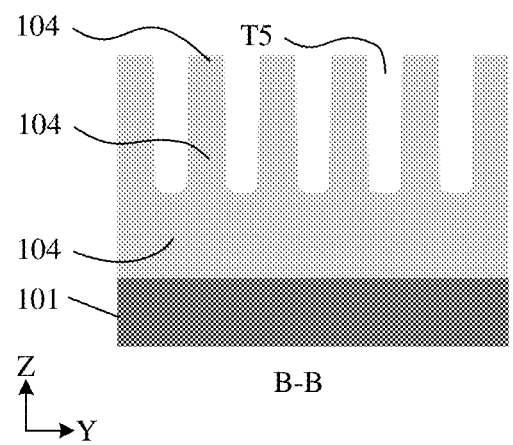
FIG. 10A    FIG. 10B
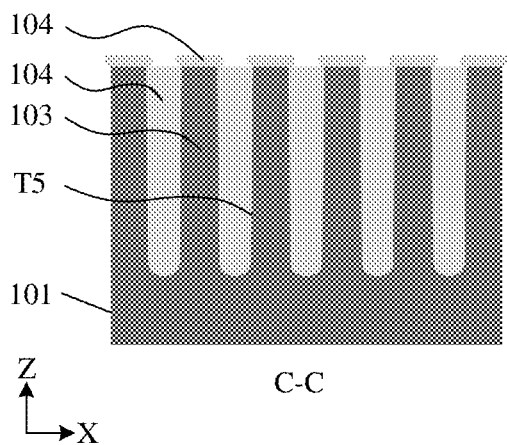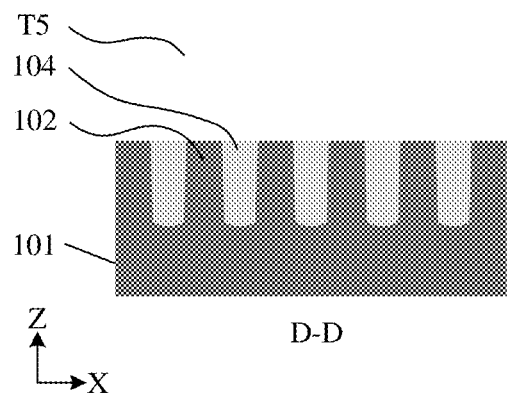
FIG. 10C    FIG. 10D

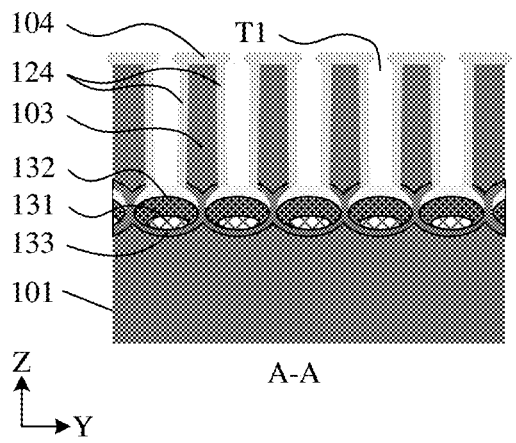 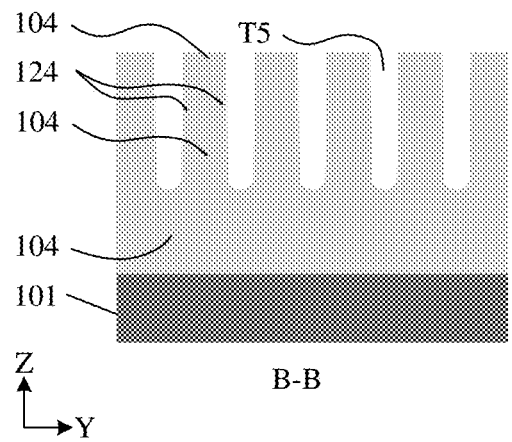
FIG. 17A  FIG. 17B
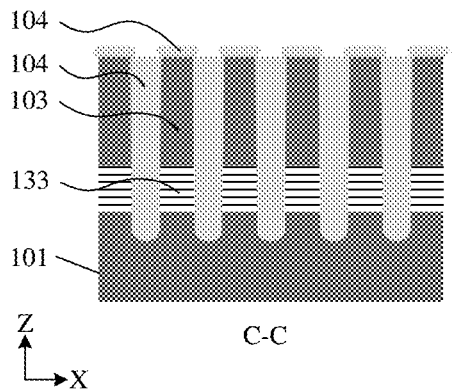 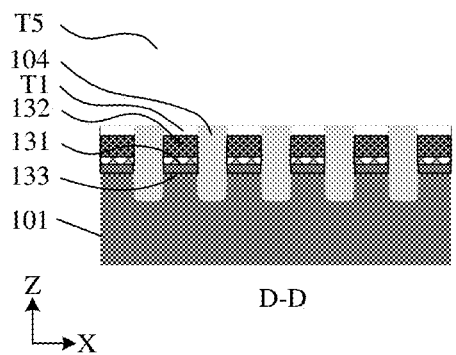
FIG. 17C  FIG. 17D
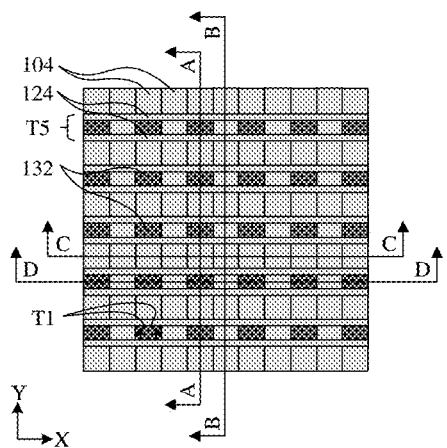
FIG. 17E

SEMICONDUCTOR STRUCTURE, METHOD FOR MANUFACTURING SAME AND MEMORY

CROSS-REFERENCE TO RELATED APPLICATIONS

This application is based on and claims priority to Chinese Patent Application No. 202210869849.7, filed on Jul. 21, 2022, and entitled "SEMICONDUCTOR STRUCTURE, METHOD FOR MANUFACTURING SAME AND MEMORY", the contents of which are hereby incorporated by reference in its entirety.

TECHNICAL FIELD

The disclosure relates to the technical field of semiconductors, in particular to a semiconductor structure, a method for manufacturing the same, and a memory.

BACKGROUND

A memory array architecture of a dynamic random access memory (DRAM) is an array composed of memory cells, each of which includes one transistor and one capacitor (i.e. 1T1C memory cell). The gate of the transistor is connected to the word line, the drain is connected to the bit line, and the source is connected to the capacitor.

As a dimension of the DRAM keeps decreasing, so do dimensions of the size of the memory array unit. How to ensure the performance of the conductor lines (such as the bit lines) in the memory array unit of a dynamic random access memory has become an urgent problem to be solved.

SUMMARY

In view of this, embodiments of the disclosure provide a semiconductor structure, a method for manufacturing the same and a memory.

According to a first aspect of the disclosure, a semiconductor structure is provided. The semiconductor structure includes a plurality of active pillars and a plurality of conductor lines.

Each of the plurality of conductor lines includes a plurality of metal layers located in a gap between two adjacent ones of the active pillars and a metal compound layer partially surrounding the plurality of active pillars.

According to a second aspect of the disclosure, a memory is provided, which includes one or more semiconductor structure as described in any of the above-described embodiments of the disclosure.

According to a third aspect of the disclosure, a method for manufacturing a semiconductor structure is provided, which includes the following operations.

A semiconductor substrate is provided.

A first trench is formed in the semiconductor substrate.

A metal layer is formed in the first trench by electroplating.

A metal compound layer is formed by reacting the metal layer with the semiconductor substrate surrounding and in contact with the metal layer. The metal compound layer at least is used as conductor lines.

BRIEF DESCRIPTION OF THE DRAWINGS

FIG. 3A to FIG. 7D schematically show cross-section of the semiconductor structure during a manufacturing process provided by embodiments of the disclosure.

FIG. 9A to FIG. 15D schematically show cross-section of the semiconductor structure during a manufacturing process e provided by embodiments of the disclosure.

FIG. 16A to FIG. 17E schematically show cross-section and top views of the semiconductor structure during a manufacturing process provided by embodiments of the disclosure.

Figure 1:
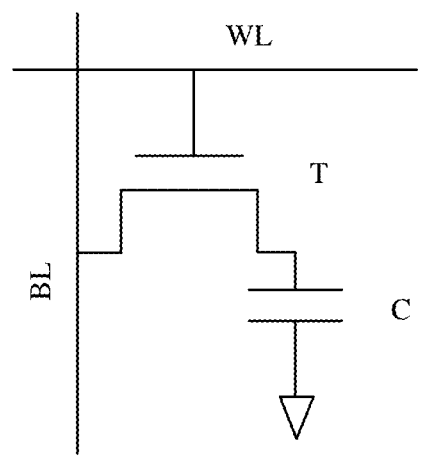
FIG. 1 schematically shows the circuit connection of a DRAM transistor provided by embodiments of the disclosure.

In the above drawings (which are not necessarily drawn to scale), similar reference numerals may describe similar components in different views. Similar reference numerals with different letter suffixes may represent different examples of similar components. The accompanying drawings generally illustrate the various embodiments discussed herein by way of example and not limitation.

DETAILED DESCRIPTION

In order to make the technical solution and advantages of the embodiments of the present disclosure clearer, the technical solution of the disclosure will be further explained in detail below with reference to the accompany drawings and embodiments. Although exemplary embodiments of the disclosure are shown in the drawings, it is to be understood that the disclosure may be embodied in various forms and should not be limited by the embodiments set forth herein. On the contrary, these embodiments are provided to enable a more thorough understanding of the disclosure and to fully convey the scope of the disclosure to those skilled in the art.

The disclosure will be described in more detail by way of example in the following paragraphs with reference to the accompany drawings. The advantages and features of the disclosure will become more apparent from the following description and the claims. It is to be noted that the drawings are provided in a very simplified form with inaccurate proportions to illustrate the purposes of the embodiments of the disclosure in a convenient and clear way.

It is understood that the meanings of "on . . . ", "over . . . " and "above . . . " of the disclosure should be interpreted in the broadest scope, so that "on . . . " not only means "on" something without intervening features or layers (that is, directly on something), but also means "on" something with intervening features or layers.

In addition, for ease of description, spatial relative terms such as "on . . . ", "over . . . ", "above . . . ", "up", "upper portion" and the like may be used herein to describe a relationship of one element or feature to another element or feature as shown in the drawings. In addition to the orientations depicted in accompany drawings, the spatial relative terms are intended to encompass different orientations of a device in use or operation. The device may be oriented in other ways (rotating 90 degrees or in other orientations) and similarly the spatial relative descriptors used herein may be interpreted accordingly.

In the embodiments of the disclosure, a term "substrate" refers to a material on which a subsequent layer of material is added. The substrate itself may be patterned. The material added on a top of the substrate may be patterned or may remain unpatterned. In addition, the substrate may include a variety of semiconductor materials, such as silicon, silicon germanium, germanium, gallium arsenide, indium phosphide, and the like. Alternatively, the substrate may be made of a non-conductive material, such as glass, plastic or sapphire wafer.

In the embodiments of this disclosure, the term "layer" refers to a portion of an object that includes a region having a thickness. The layer may extend over an entirety of a lower or upper structure, or may have a range smaller than a range of the lower or upper structure. Further, the layer may be a region of a homogeneous or heterogeneous continuous structure whose thickness is less than a thickness of a continuous structure. For example, the layer may be located between a top surface and a bottom surface of the continuous structure, or the layer may be located between any pair of horizontal surfaces at the top and bottom surfaces of the continuous structure. The layer may extend horizontally, vertically, and/or along an inclined surface. The layer may include multiple sublayers. For example, an interconnect layer may include one or more conductors and contact sublayers in which interconnect lines and/or via contacts are formed, and one or more dielectric sublayers.

In the embodiments of the disclosure, the terms "first", "second" and the like are used to distinguish similar objects and they are not necessarily used to describe a particular order or sequence.

The semiconductor structure according to the embodiments of the disclosure will be used in subsequent processes to form at least a part of a final device structure. The final device may include a memory, including but not limited to a dynamic random access memory, which will be described below only as an example.

However it should be noted that the following description of a DRAM by the embodiments is intended only to illustrate the present disclosure and is not intended to limit the scope of the present disclosure.

With the development of DRAM technology, a dimension of memory cells becomes smaller and smaller, and its array architecture is changed from $8F^2$ to $6F^2$ and then to $4F^2$. In addition, based on requirements in relation to ions and leakage current in the DRAM, a memory architecture changes from a planar array transistor to a recess gate array transistor, and then from the recess gate array transistor to a buried channel array transistor, and then from the buried channel array transistor to the vertical channel array transistor.

In some embodiments of the present disclosure, whether planar transistors or buried transistors are provided, each DRAM is composed of multiple memory cell structures, and each of the memory cell structures is mainly composed of one transistor and one memory cell (memory capacitor) controlled by the transistor, that is, an architecture of the DRAM includes one transistor (Transistor, T) and one capacitor (Capacitor, C) (1T1C). A main action principle of 1T1C is to use an amount of charges stored in the capacitor to represent whether a binary bit is 1 or 0.

FIG. 1 is a schematic diagram of a control circuit using a 1T1C architecture provided by the embodiments of the present disclosure. As shown in FIG. 1, the drain of a transistor T is electrically connected with a bit line (BL), the source of the transistor T is electrically connected with one of the electrode plates of a capacitor C, the other electrode plate of the capacitor C may be connected with a reference voltage, which can be a ground voltage or another voltage, and the gate of the transistor T is connected with a word line (WL). A voltage is applied through a word line WL to control the transistor T to be turned on or off, and a bit line BL is used to perform a read or write operation on the transistor T when the transistor T is turned on.

However, in order to realize the development of miniaturization of a memory, a dimension of the dynamic random access memory keeps decreasing, so do dimensions of conductive wires, such as bit lines in memory array cells of the memory, which makes it more and more difficult to form the bit lines and to ensure the quality of the bit lines. For example, voids in the bit lines, poor contact with transistors or the like are easy to affect the conductivity of the bit lines, and increase the contact resistance of the bit lines.

Based on this, in order to solve one or more of the above problems, embodiments of the disclosure provide a method for manufacturing a semiconductor structure. The method for manufacturing a semiconductor structure provided by embodiments of the disclosure includes the following operations.

A semiconductor substrate is provided.

First trenches are formed in the semiconductor substrate.

A metal layer is formed in each of the first trenches by electroplating.

A thermal treatment is performed to allow the metal layer to react with the semiconductor substrate surrounding and in contact with the metal layer, so as to form a metal compound layer. At least the metal compound layer is used as conductor lines.

The core of the method for manufacturing a semiconductor structure provided in the embodiments of the disclosure is to form a conductive material with no voids, good compactness, and good contact with the semiconductor substrate at the bottom of the trench by electrochemical plating process. When the conductive material with no voids, good compactness, and good contact with the semiconductor substrate reacts with the semiconductor substrate to form a continuously extending metal compound layer, the metal compound layer also has the characteristics of compactness, no voids, and continuously extending. When the metal compound layer is used as the conductor lines, the conductor lines have high compactness and good contact with the active pillars.

It should be noted that the conductor lines here may be bit lines or word lines, and the following only takes the conductor lines as the bit lines for description.

It could be understood that, in the embodiments of the disclosure, the method for manufacturing a semiconductor structure provided herein may at least include three core solutions to obtain three semiconductor structures respectively. For facilitating understanding of the disclosure, here and hereafter, the embodiments of the disclosure will be described through methods for manufacturing a semiconductor structure corresponding to obtain three semiconductor structures respectively, which are specifically the following three solutions. As for the first solution, by electroplating and thermal treatment processes, bit lines are formed in trenches extending in the direction in which the bit lines extend. In this solution, the first metal compound layer is used as the bit lines. As for the second solution, by electroplating and thermal treatment processes, bit lines are formed in trenches extending in the direction in which word lines extend. In this solution, at least the third metal compound layer is used as the bit lines. As for the third solution, by electroplating and thermal treatment processes, bit lines are formed in trenches extending in the direction in which the bit lines extend and trenches extending in the direction in which the word lines extend. In this solution, the first metal compound layer together with at least the second metal compound layer is used as the bit lines.

First Solution

Figure 2:
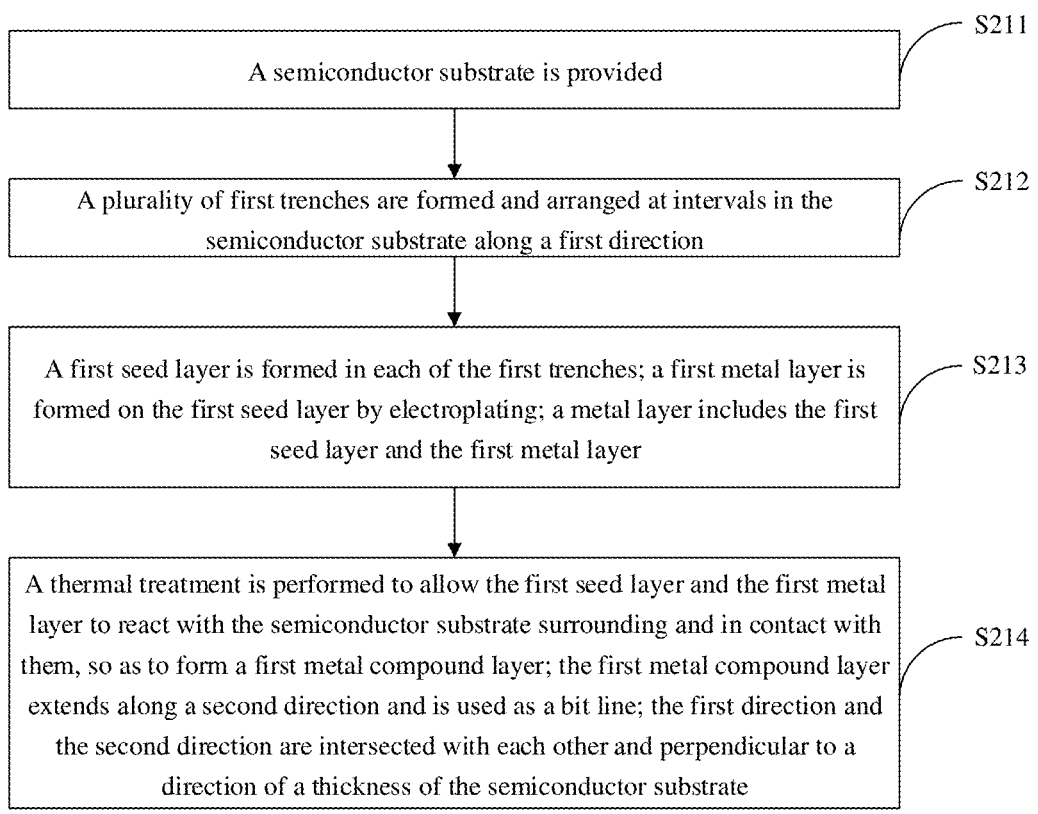
FIG. 2 schematically shows a flowchart of a method for manufacturing a semiconductor structure provided by embodiments of the disclosure.
Figure 3A:
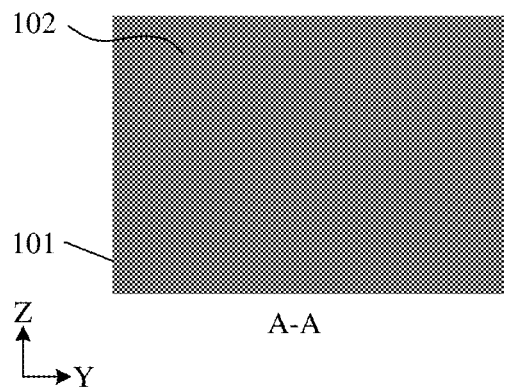
Figure 3B:
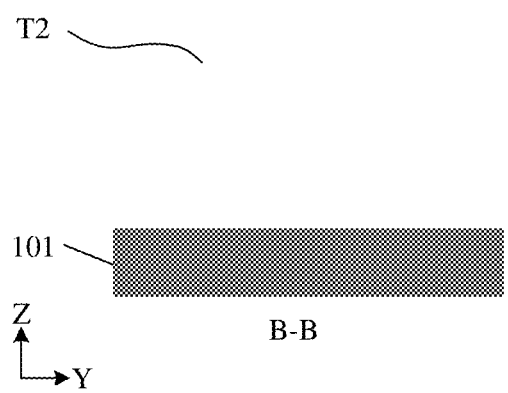
Figure 3C:
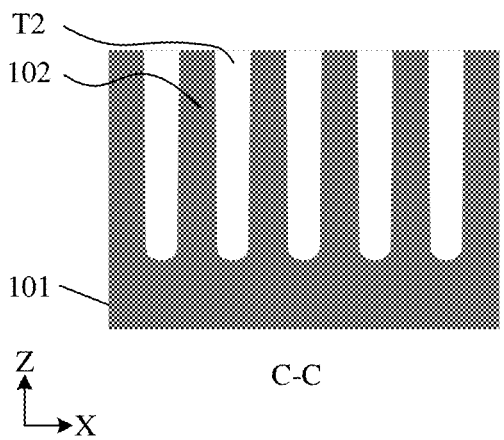
Figure 3D:
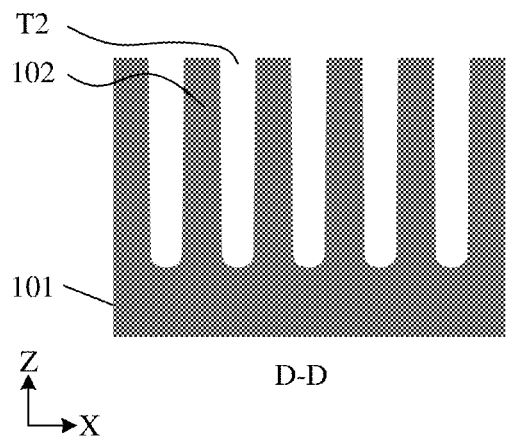
Figure 4A:
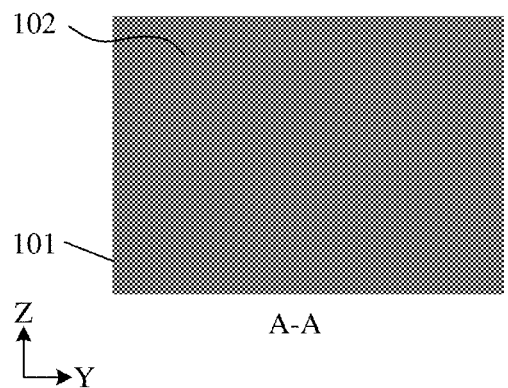
Figure 4B:
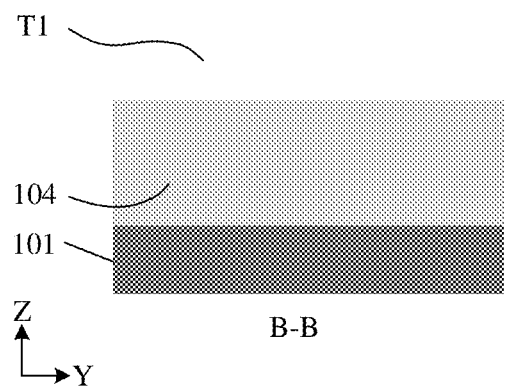
Figure 4C:
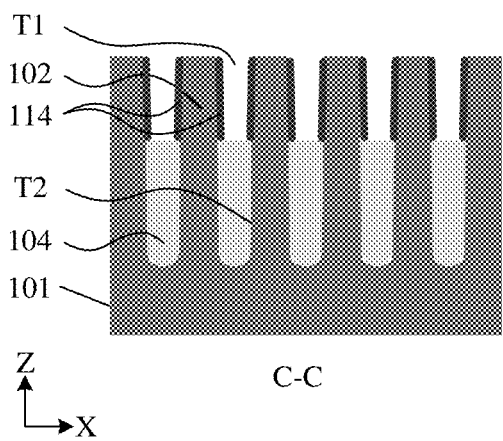
Figure 4D:
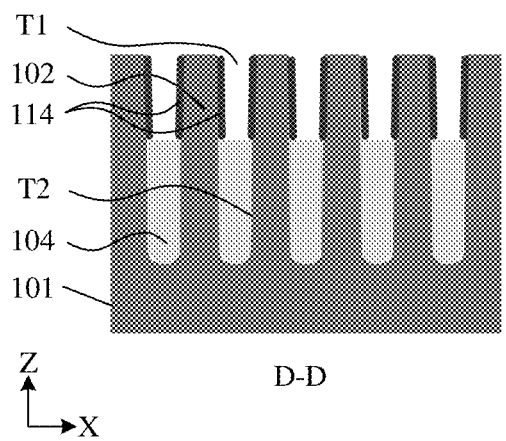
Figure 7A:
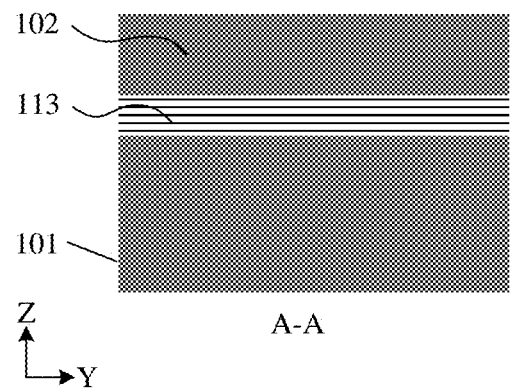
Figure 7B:
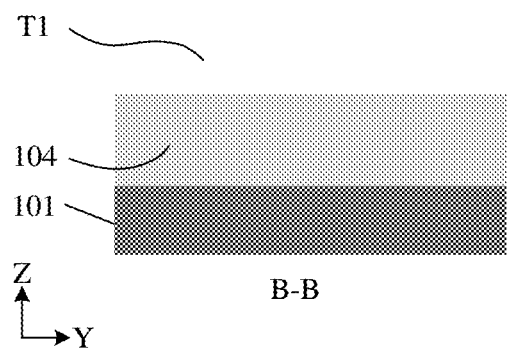
Figure 7C:
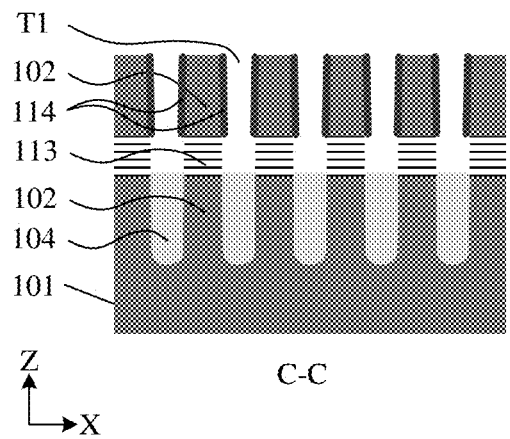
Figure 7D:
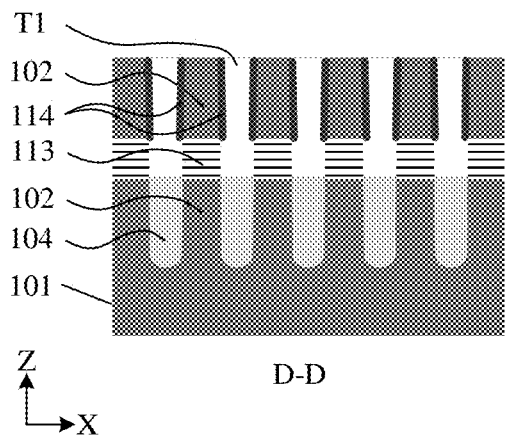

FIG. 2 schematically shows a flowchart of a method for manufacturing a semiconductor structure provided by embodiments of the disclosure. In order to clearly illustrate the disclosure, the method for manufacturing a semiconductor structure provided by embodiments of the disclosure includes the following operations.

In S211, a semiconductor substrate is provided.

The formation of the first trenches includes the following operations.

In S212, a plurality of first trenches arranged at intervals along a first direction are formed in the semiconductor substrate.

The formation of the metal layer includes the following operations.

In S213, a first seed layer is formed in the first trench, and a first metal layer is formed on the first seed layer by electroplating. The metal layer includes the first seed layer and the first metal layer.

The formation of the metal compound layer includes the following operations.

In S214, a thermal treatment is performed to allow the first seed layer and the first metal layer to react with the semiconductor substrate surrounding and in contact with the first seed layer and the first metal layer, so as to form a first metal compound layer. The first metal compound layer extends in a second direction, and is used as a bit line. The first direction and the second direction are intersected with each other and perpendicular to a direction of a thickness of the semiconductor substrate.

It should be understood that the operations shown in FIG. 2 are not exclusive and that other operations may be performed before, after, or between any of the operations shown in FIG. 2. The sequence of the operations shown in FIG. 2 can be adjusted according to actual needs.

Here and hereafter, the first direction and the second direction refer to two orthogonal directions perpendicular to the direction of the thickness of the semiconductor substrate. The third direction is a direction parallel to the thickness of the semiconductor substrate. That is, the third direction is an extension direction of the active pillars.

In some embodiments, the included angle between the first direction and the second direction ranges from 0 to 90 degrees. In some specific embodiments, the first direction may be perpendicular to the second direction. It could be understood that the included angle between the first direction and the second direction defines a positional relationship of the active pillars arrayed along the first direction and the second direction.

For example, the first direction is represented as the X direction in the accompany drawings. The second direction is represented as the Y direction in the accompany drawings. The third direction is represented as the Z direction in the accompany drawings.

FIG. 3A to FIG. 7D are cross-sectional diagrams of a semiconductor structure during its manufacturing process provided by an embodiment of the disclosure. The method for manufacturing the semiconductor structure provided by the embodiment of the disclosure will be described in detail with reference to FIG. 2 and FIG. 3A to FIG. 7D.

In order to clearly describe the disclosure, the following embodiment is described with the first direction being perpendicular to the second direction as an example. Illustratively, take FIG. 17A to FIG. 17D as examples, the first direction is the X-axis direction shown in FIG. 17E. The second direction is the Y-axis direction shown in FIG. 17E. The third direction is the Z-axis direction shown in FIG. 17A to FIG. 17D. However, it should be noted that the following description of the directions by the embodiments is intended only to illustrate the present disclosure and is not intended to limit the scope of the present disclosure.

It should be noted that figures numbered with a same number in FIG. 3A to FIG. 7D, and FIG. 9A to FIG. 17D represent plan schematic diagrams of multiple views in at least one process operation. Take FIG. 17A to FIG. 17D as examples, FIG. 17E is a top-view schematic diagram, and FIG. 17A to FIG. 17D are cross-sectional schematic diagram along cross-sectional directions A-A, B-B, C-C and D-D in FIG. 17E, respectively. So do FIG. 3A to FIG. 7D and FIG. 9A to FIG. 16D, which will not be repeated here or hereafter.

S211 is performed. Here, the material of the semiconductor substrate includes, but is not limited to, silicon.

With reference to FIG. 3A to FIG. 4D, S212 is performed. A semiconductor substrate is provided and first trenches are formed in the semiconductor substrate.

In some embodiments, the formation of the plurality of first trenches arranged at intervals along the first direction in the semiconductor substrate includes the following operations.

A plurality of second trenches arranged at intervals along the first direction are formed in the semiconductor substrate.

The second trenches are partially filled with an insulating material to form the first trenches.

Referring to FIG. 3A to FIG. 3D, the second trenches are formed.

A semiconductor substrate 101 is provided. The material of the semiconductor substrate 101 may include silicon (Si), germanium (Ge), silicon germanium (SiGe) and the like.

A first etching is performed on the top surface of the semiconductor substrate 101 by lithography-etch (LE) to form the plurality of second trenches T2 arranged at intervals in the first direction in the semiconductor substrate. Here, each of the second trenches T2 extends along the second direction. The second trenches T2 divide the semiconductor substrate 101 into multiple structures including active strips 102.

Here, the second trenches T2 are located in the semiconductor substrate. That is, the depth of the second trenches T2 in the third direction is smaller than the thickness of the semiconductor substrate 101 in the third direction.

In some embodiments, the second trenches T2 include, but are not limited to, shallow trench isolation (STI) structures.

The first etching includes, but is not limited to, a dry plasma etching process.

Referring to FIG. 4A to FIG. 4D, the second trenches are partially filled to form the first trenches.

The second trenches are partially filled with an insulating material 104 by a physical vapor deposition (PVD) process, a chemical vapor deposition (CVD) process, an atomic layer deposition (ALD) process, and the like, so as to form the first trenches T1. It could be understood that, the depth of the first trenches T1 in the third direction is smaller than the depth of the second trenches T2 in the third direction.

Here, the insulating material 104 may include, but is not limited to, silicon oxide.

In some embodiments, the method further includes the following operations.

A first protective layer covering at least a sidewall of the first trench is formed.

Part of the insulating material is removed to expose part of the sidewall of the first trench.

The first seed layer and the first metal layer are formed on a remaining insulating material layer in the first trench. A top surface of the first metal layer is substantially flush with a bottom end of the first protective layer.

With continued reference to FIG. 4A to FIG. 4D, a first protective layer is formed.

After the first trenches T1 are formed, a first protective material (not shown in FIG. 4A to FIG. 4D) is deposited on the bottom surfaces and sidewalls of the first trenches T1 by a process such as PVD, CVD, ALD, and the like. The first protective material at the bottoms of the first trenches T1 may be removed by a plasma etching process or reactive ion etching process to form the first protective layer 114 covering at least the sidewalls of the first trenches T1.

Here, the material of the first protective layer 114 includes, but is not limited to, silicon nitride.

Illustratively, a plasma enhanced chemical vapor deposition (PECVD) method is adopted to deposit silicon nitride on the sidewalls and bottoms of the first trenches T1. A plasma etching process is adopted to remove silicon nitride at the bottoms of the first trenches T1 by using hydrofluoric acid, to obtain silicon nitride retained on the sidewalls of the first trenches T1.

With continued reference to FIG. 4A to FIG. 5D, with the first protective layer 114 as a mask (FIG. 4A to FIG. 4D), part of the insulating material 104 is removed by etching, to enlarge the bottom and expose part of the sidewall of each of the first trenches T1. The exposed part of the sidewall of the first trench T1 corresponds to the sidewall, not covered by the first protective layer 114, of the active strip 102. Here, the sidewall not covered of the active strip 102 corresponds to the maximum contact area where the first seed layer and the first metal layer (not shown in FIG. 4A to FIG. 4D) react with the active strip in a subsequent process. That is to say, the maximum thickness of the bit line BL (including the first metal compound layer 113) formed in the subsequent process is substantially equivalent to the increased depth of the first trench.

Here, the adopted etching process may include s wet etching process, a dry etching process, and the like.

Illustratively, in the wet etching process, with the first protective layer 114 as a mask, an etchant is introduced into the bottom of the first trench T1. The depth in the Z-axis direction of the bottom of the first trench T1 is increased by isotropic etching of the etchant. Specifically, the first seed layer and the first metal layer (not shown in FIG. 5A to FIG. 5D) are formed on the remaining insulating material layer in the first trench. The top surface of the first metal layer is substantially flush with the bottom end of the first protective layer. It could be understood that. It is to be understood that, the thickness of the bit line BL (including the first metal compound layer 113) formed in a subsequent process is substantially equivalent to the increased depth of the first trench.

In the embodiment of the disclosure, by taking the first protective layer as a mask, the increased depth of the first trench can be more conveniently controlled, thereby controlling the thickness of the bit line BL (including the first metal compound layer 113) formed in subsequent processes, and thus increasing the process window.

In some embodiments, with continued reference to FIG. 5A to FIG. 5D, after the bottom of each first trench T1 is enlarged to expose part of the sidewall of the first trench T1, part, not covered by the first protective layer 114 of the active strip 102 is removed by etching. That is, the active strip 102 is over-etched in the first trench T1 to obtain the first trench having a bowl-shaped space (not shown in FIG. 5A to FIG. 5D, but it could be understood here with reference to the first trench T1 having the bowl-shaped space in FIG. 12A below).

Here, the adopted etching process may include a wet etching process, a dry etching process, and the like.

Illustratively, in the wet etching process, with the first protective layer 114 as a mask, an etchant is introduced into the bottom of the first trench T1. The width of the bottom of the first trench T1 in the X-axis direction is increased by isotropic etching of the etchant, to obtain the first trench having the bowl-shaped space.

Further, the first seed layer and the first metal layer (not shown in FIG. 5A to FIG. 5D) are formed on the remaining insulating material layer in the first trench having the bowl-shaped space. The top surface of the first metal layer is substantially flush with the bottom end of the first protective layer. It is to be understood that, the thickness of the bit line BL (including the first metal compound layer 113) formed in a subsequent process is substantially equivalent to the increased depth of the first trench.

In S213, the metal layer is formed, which includes a first seed layer and a first metal layer.

With reference to FIG. 6A to FIG. 6D, the first seed layer is formed.

A conductive material is deposited on the insulating material 104 in the first trench T1 by a process such as PVD, CVD, ALD, and the like. The conductive material is used as the first seed layer 111. The first seed layer is used as a seed layer for forming the first metal layer 112 in a subsequent process.

Here, the material of the first seed layer 111 may include at least one of cobalt (Co), copper (Cu), zinc (Zn), nickel (Ni), chromium (Cr), tin (Sn), silver (Ag), and gold (Au).

Illustratively, a metal material, such as cobalt, is deposited on the bottom of the first trench T1 (i.e., the top of the insulating material 104 filled in the second trench) by PVD process.

With continued reference to FIG. 6A to FIG. 6D, the first metal layer is formed.

A conductive material is deposited on the first seed layer 111 by a electrochemical plating (ECP) process to form the first metal layer 112.

Here, the material of the first metal layer 112 may include at least one of cobalt, copper, zinc, nickel, chromium, tin, silver, and gold.

In some embodiments, the materials of the first seed layer 111 and the first metal layer 112 may be the same or different. In some specific embodiments, the materials of the first seed layer 111 and the first metal layer 112 may be the same, and both include cobalt.

In some embodiments, the metal material is deposited on the first seed layer 111 with a first thickness by the ECP process, and then back etching is performed to control the thickness of the finally formed first metal layer. That is, the total thickness of the first seed layer 111 and the first metal layer is controlled, and thus the thickness of the bit line BL formed in the subsequent process is also controlled.

In some embodiments, the thickness of the first metal layer 112 is greater than the thickness of the first seed layer 111.

In some specific embodiments, the total thickness of the first seed layer 111 and the first metal layer 112 may range from 20 nm to 50 nm.

With reference to FIG. 7A to FIG. 7D, in S214, a first metal compound layer is formed.

By adopting a thermal treatment, both the first seed layer 111 and the first metal layer 112 are reacted with the semiconductor substrate 101 in contact with them to form a first metal compound layer 113. Here, the first metal compound layer 113 extends along the second direction. The first metal compound layer 113 is used as a bit line.

In practice, the first metal compound layer 113 may be formed by rapid thermal process (RTP).

In some specific embodiments, after the first metal compound layer is formed, the first seed layer and the first metal layer in the first trench are removed such that a plurality of the first metal compound layers are arranged at intervals and electrically isolated from each other along the first direction. An insulating material (not shown in FIG. 7A to FIG. 7D) is filled in the first trench after removing the first seed layer and the first metal layer from the first trench.

In some specific embodiments, the material of each of the bit lines is included in the first metal compound layer 113. Here, the metal element in the first metal compound layer 113 includes at least one of cobalt, copper, zinc, nickel, chromium, tin, silver and gold.

Illustratively, the materials of the first seed layer 111 and the first metal layer 112 both include cobalt, and the material of the semiconductor substrate 101 includes silicon (Si). By performing the RTP, cobalt reacts with silicon to generate cobalt silicide. Due to the presence of cobalt silicide, when the first metal compound layer 113 is used as the bit line BL, ohmic contact is formed between the bit line BL (including the first metal compound layer 113) and the semiconductor substrate 101 (including the active strip 102), which is beneficial to reducing the contact resistance.

In some specific embodiments, the cross-sectional shape of the bit line BL includes, but is not limited to an elongated shape. Here, the cross-section may be understood as a cross-section along the second direction and the third direction (Y-Z cross-section).

In some specific embodiments, the thickness of the bit line BL is in a range of 20 nm to 50 nm.

It should be noted that, in the embodiments of the disclosure, the active strips are used to form a plurality of active pillars arranged in an array along the first direction and the second direction in a subsequent process (the detailed process of forming the active pillars 103 by the active strips 102 can be understood with reference to FIG. 9A to FIG. 10D below).

In the embodiments of the disclosure, firstly, part of the conductive material is deposited by thin film deposition to form the first seed layer, and then the conductive material is grown on the first seed layer by electrochemical plating to form the first metal layer, which is beneficial to forming the first seed layer and the first metal layer that are compact and void-free. When the first seed layer and the first metal layer that are dense and void-free are reacted with the semiconductor substrate to form the first metal compound layer extending in the second direction, the first metal compound layer also has characteristics of compactness and no voids. When the first metal compound layer is used as the bit line BL, the bit line BL also has high compactness without defects such as voids.

Second Solution

Figure 8:
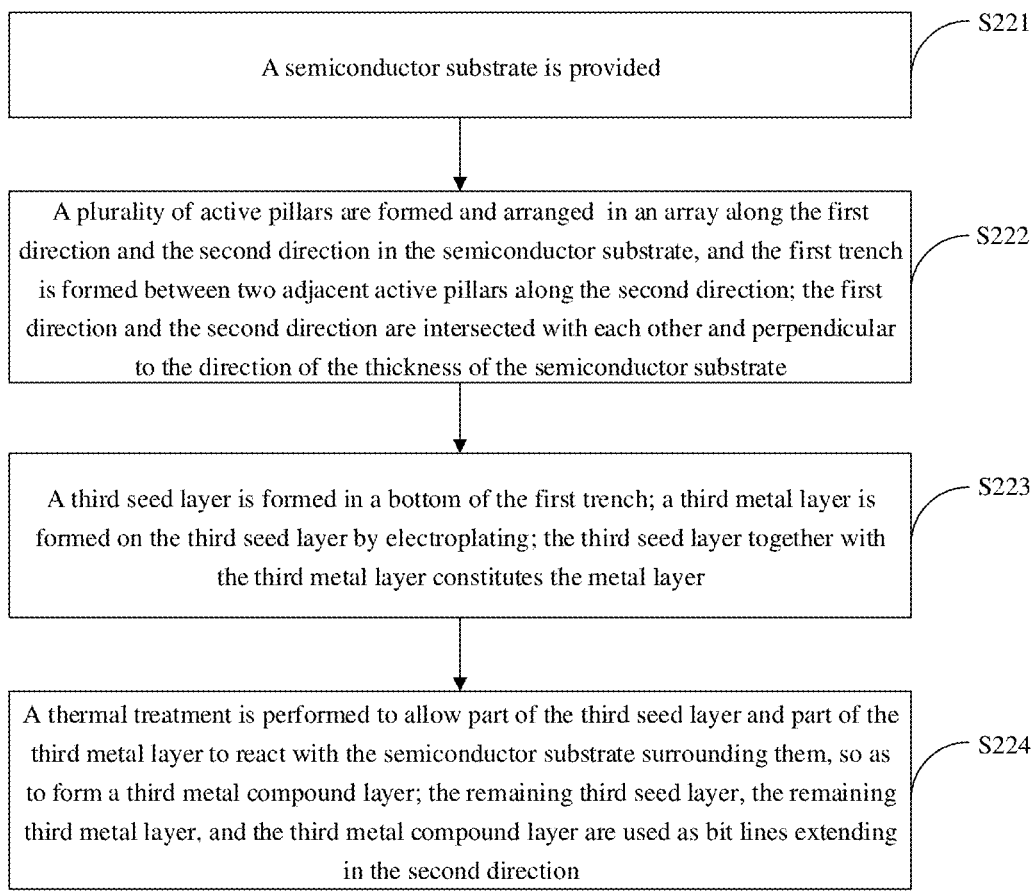
FIG. 8 schematically shows a flowchart of another method for manufacturing a semiconductor structure provided by embodiments of the disclosure.
Figure 11A:
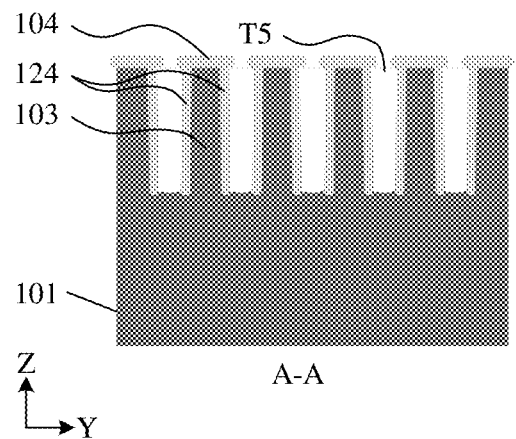
Figure 11B:
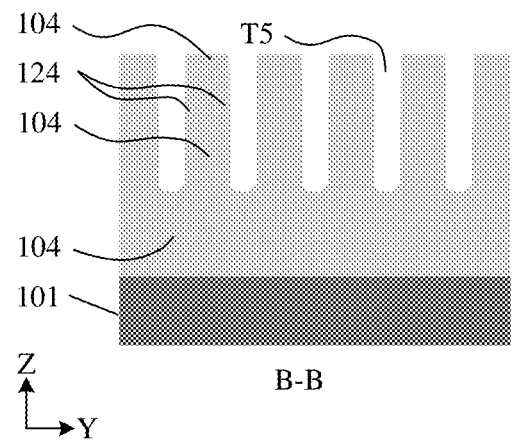
Figure 11C:
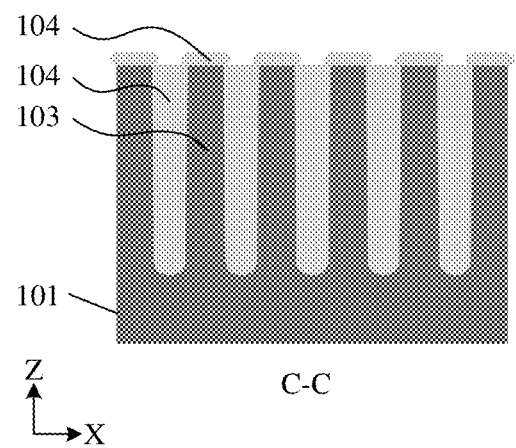
Figure 11D:
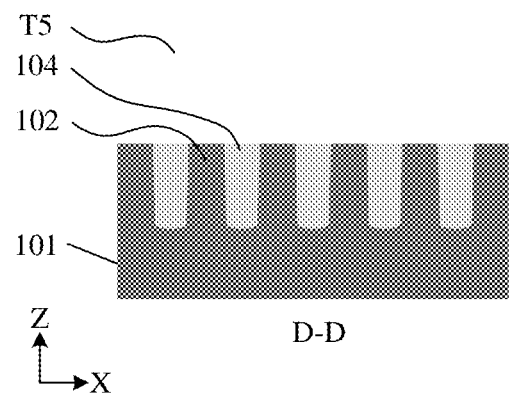
Figure 12A:
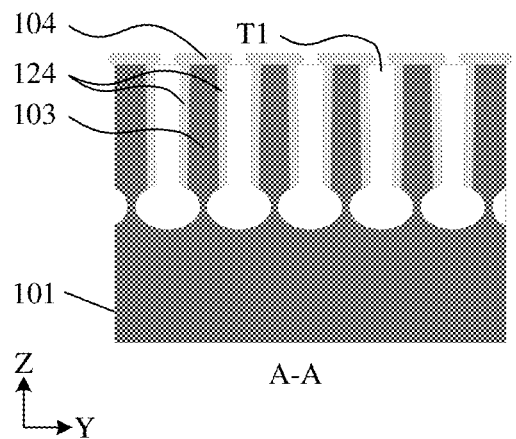
Figure 12B:
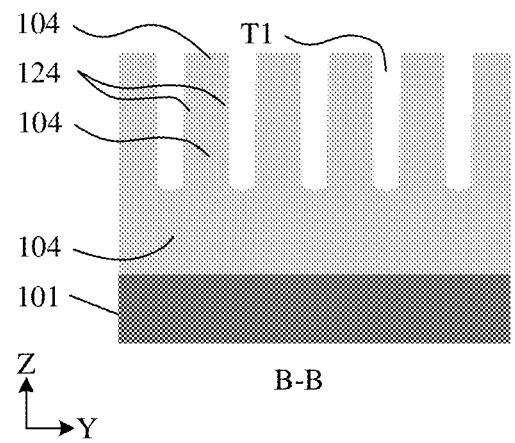
Figure 12C:
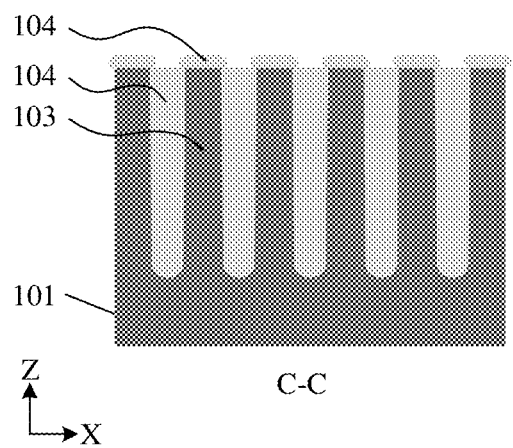
Figure 12D:
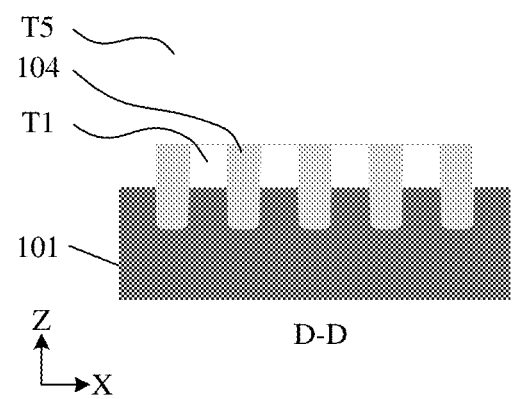
Figure 13A:
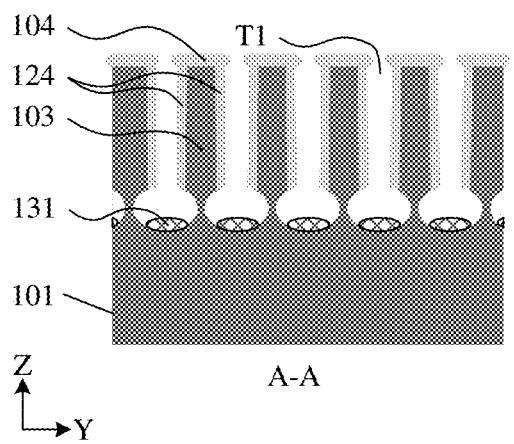
Figure 13B:
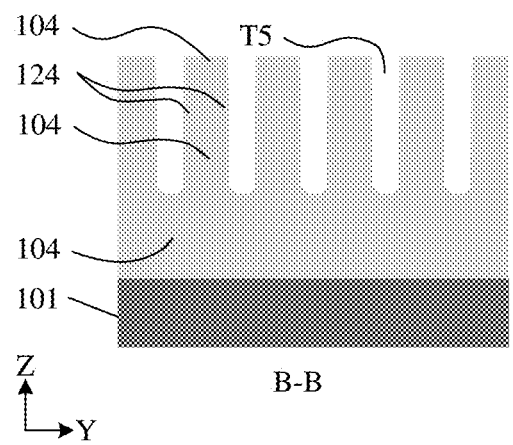
Figure 13C:
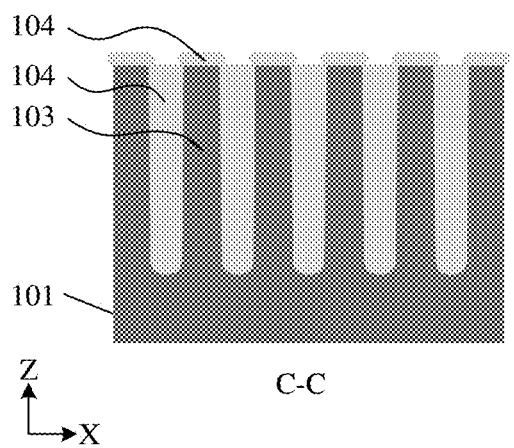
Figure 13D:
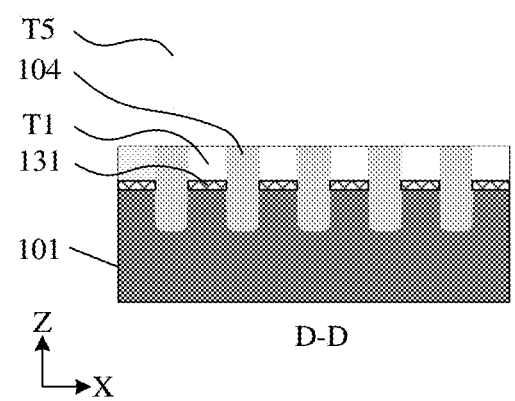
Figure 14A:
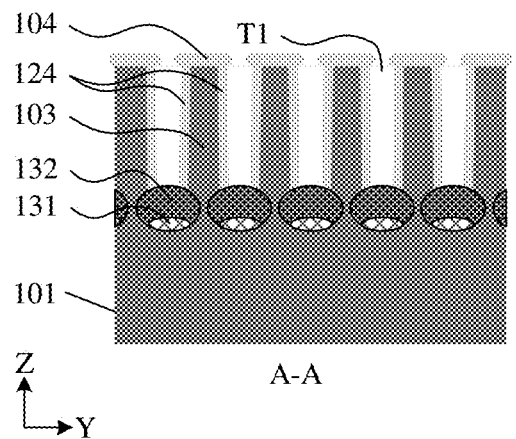
Figure 14B:
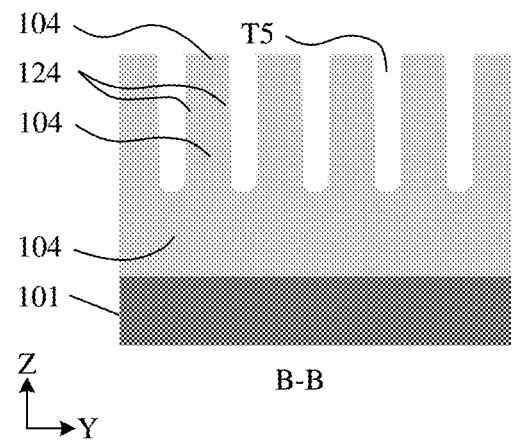
Figure 14C:
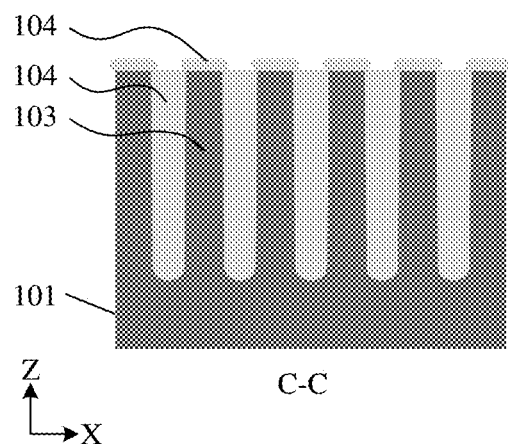
Figure 14D:
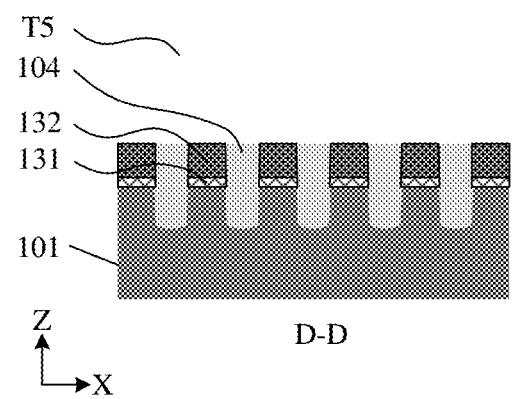
Figure 15A:
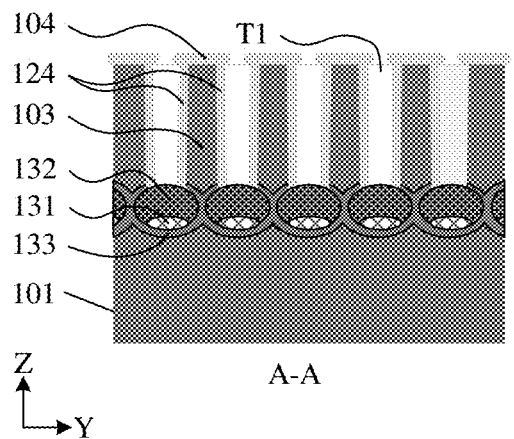
Figure 15B:
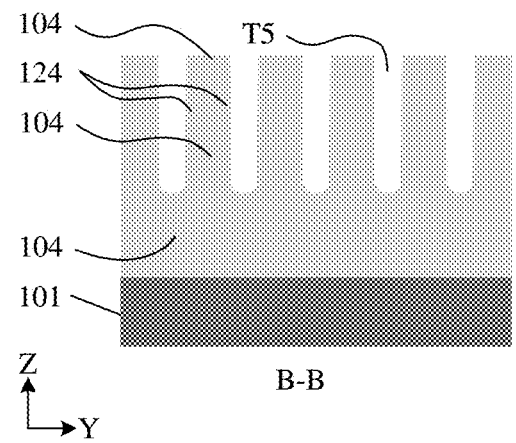
Figure 15C:
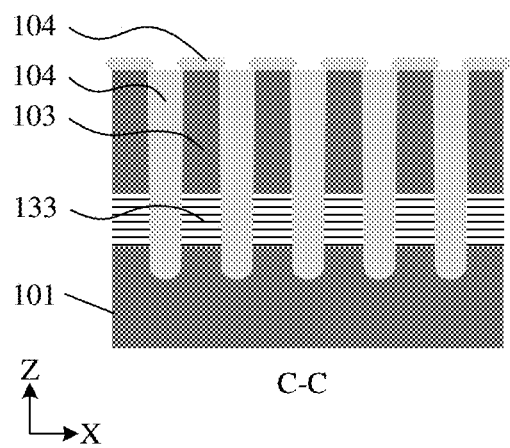
Figure 15D:
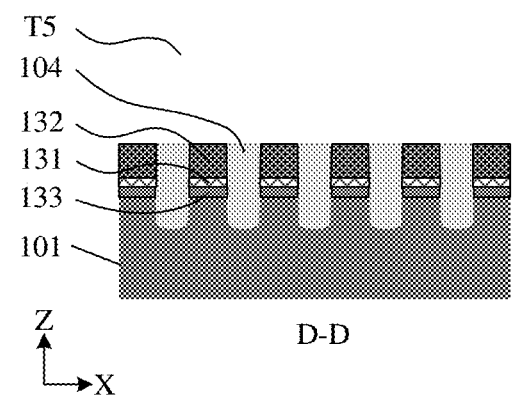
Figure 16A:
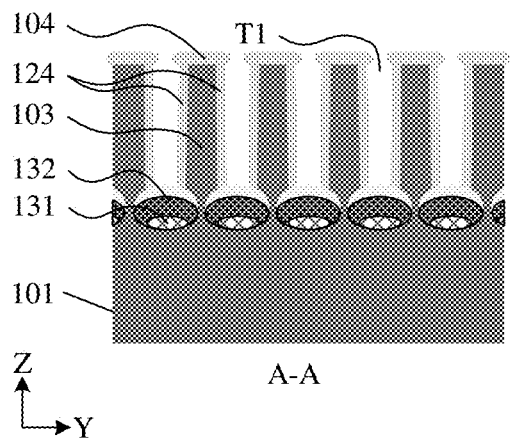
Figure 16B:
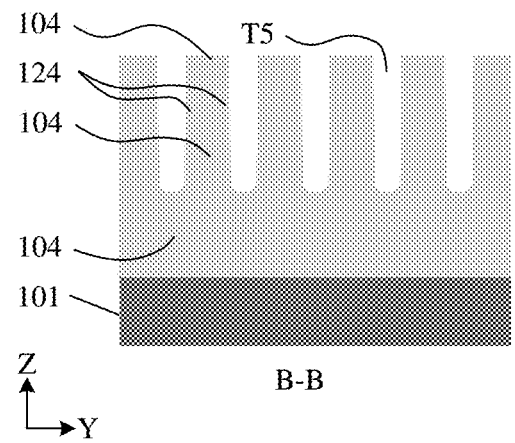
Figure 16C:
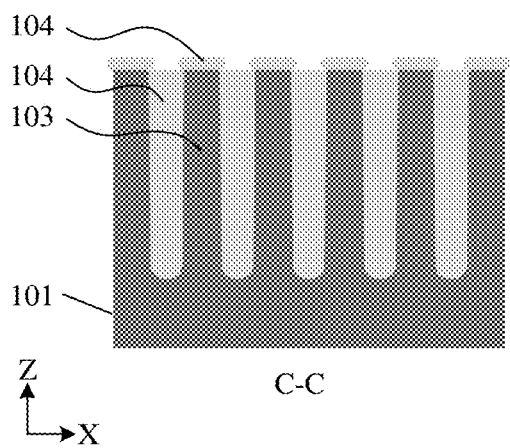
Figure 16D:
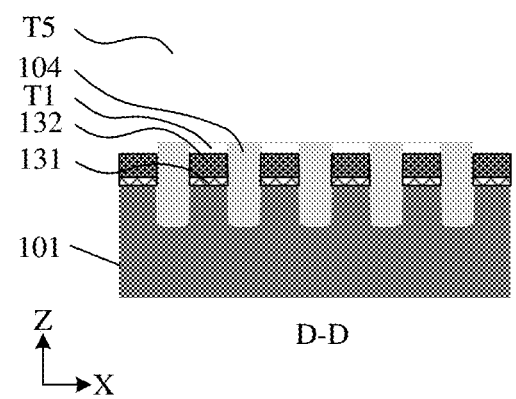

FIG. 8 schematically shows a flowchart of another method for manufacturing a semiconductor structure provided by embodiments of the disclosure. In order to clearly illustrate the disclosure, another method for manufacturing a semiconductor structure provided by embodiments of the disclosure includes the following operations.

In S221, a semiconductor substrate is provided.

The formation of the first trench includes the following operations.

In S222, a plurality of active pillars arranged in an array along the first direction and the second direction are formed in the semiconductor substrate. A first trench is formed between two adjacent active pillars along the second direction. The first direction and the second direction are intersected with each other and perpendicular to a direction of a thickness of the semiconductor substrate.

The formation of the metal layer includes the following operations.

In S223, a third seed layer is formed in a bottom of the first trench. A third metal layer is formed on the third seed layer by electroplating. The third seed layer together with the third metal layer constitutes the metal layer.

The formation of the metal compound layer includes the following operations.

In S224, a thermal treatment is performed to allow part of the third seed layer and part of the third metal layer to react with the semiconductor substrate surrounding the third seed layer and the third metal layer to form the third metal compound layer. The remaining third seed layer, the remaining third metal layer, and the third metal compound layer are used as bit lines extending in the second direction.

FIG. 8 schematically shows a flowchart of a method for manufacturing a semiconductor structure provided by embodiments of the disclosure. It should be understood that the operations shown in FIG. 8 are not exclusive and that other operations may be performed before, after, or between any of the operations shown in FIG. 8. The sequence of the operations shown in FIG. 8 can be adjusted according to actual needs. FIG. 9A to FIG. 15D schematically show cross-section of the semiconductor structure during a manufacturing process for a semiconductor structure provided by embodiments of the disclosure. The method for manufacturing a semiconductor structure provided by embodiments of the disclosure will be described in detail below in combination with FIG. 8 and FIG. 9A to FIG. 15D.

S221 is performed. Here, the material of the semiconductor substrate includes, but is not limited to, silicon.

S222 is performed. In some embodiments, the formation of the first trench between two adjacent ones of the active pillars along the second direction includes the following operations.

a. A plurality of fourth trenches arranged at interval along the first direction are formed in the semiconductor substrate, and then filled with an insulating material.
  b. A plurality of fifth trenches arranged at interval along the second direction are formed in the semiconductor substrate. A depth of the fifth trench is different from a depth of the fourth trench.
  c. Part of a bottom of the fifth trench is etched to increase part of the depth of the fifth trench and increase a width of the part with increased depth of the fifth trench along the second direction, to obtain the first trench. The part with increased depth of the fifth trench is located between two adjacent ones of the active pillars along the second direction.

With reference to FIG. 9A to FIG. 9D, operation a is performed, in which a fourth trench is formed.

A second etching is performed on the top surface of the semiconductor substrate 101 by lithography-etch to form the plurality of fourth trenches T4 arranged at intervals in the first direction in the semiconductor substrate. Here, each of the fourth trenches T4 extends along the second direction. The fourth trenches T4 divide the semiconductor substrate 101 into multiple structures including active strips 102.

Here, the fourth trenches T4 are located in the semiconductor substrate. That is, the depth of the fourth trenches T4 in the third direction is smaller than the thickness of the semiconductor substrate 101 in the third direction.

In some embodiments, the fourth trenches T4 include, but are not limited to, shallow trench isolation structures.

The second etching includes, but is not limited to, a dry plasma etching process.

The material of the semiconductor substrate 101 may include silicon, germanium, silicon germanium, and the like.

With continued reference to FIG. 9A to FIG. 9D, an insulating material is filled in the fourth trenches.

The fourth trenches T4 are filled with an insulating material 104 by a process such as PVD, CVD, ALD, and the like.

Moreover, after the fourth trenches T4 are filled with the insulating material 104, a chemical mechanical polishing (CMP) treatment is performed on the top surface of the insulating material 104 and the top surface of the active strip 102, to allow the top surface of the insulating material 104 flush with the top surface of the active strip 102.

Here, the insulating material 104 may include, but is not limited to, silicon oxide.

With reference to FIG. 10A to FIG. 10D, operation b is performed, in which the fifth trenches are formed.

By lithography-etching process, a plurality of mask layers arranged at intervals along the second direction are formed on the top surfaces of the insulating material 104 and the active strips 102. A third etching is performed on the top surfaces of the insulating material 104 and the active strips 102 to form a plurality of fifth trenches T5 arranged at intervals along the second direction in the semiconductor substrate. Here, each of the fifth trenches T5 extends along the first direction. The fifth trenches T5 divide the semiconductor substrate 101 into multiple structures including active pillars 103. Here, an insulating material 104 is filled between two adjacent ones of the active pillars 103 in the first direction. Opposite sidewalls of two adjacent ones of the active pillars 103 in the second direction are exposed in a same fifth trench T5.

Here, the depth of the fifth trenches T5 in the third direction is smaller than the depth of the fourth trenches T4 in the third direction.

In some embodiments, the fifth trenches T5 include, but are not limited to, shallow trench isolation structures.

The third etching includes, but is not limited to, a dry plasma etching process.

With continued reference to FIG. 10A to FIG. 10D, in some embodiments, after the fifth trenches T5 are formed, the mask layers formed on the top surfaces of the insulating material 104 and the active strips 102 are retained (referring to the insulating material 104 on the top surfaces of the active pillars 103 in FIG. 10A to FIG. 10D). Here, the mask layers are used to protect the top surfaces of the active pillars 103 and prevent the top surfaces of the active pillars 103 from being depleted in subsequent processes.

Here, the material of the mask layer includes, but is not limited to silicon oxide.

With reference to FIG. 11A to FIG. 11D and FIG. 12A to FIG. 12D, operation c is performed, in which the first trenches are formed.

In some embodiments, the method further includes the following operations.

A second protective layer 124 covering at least part of a sidewall of the first trench is provided. The top surface of the third metal layer is lower than the bottom end of the second protective layer (referring to FIG. 16A to FIG. 17D below). Alternatively, the top surface of the third metal layer is substantially flush with the bottom end of the second protective layer (referring to FIG. 14A to FIG. 15D below).

With reference to FIG. 11A to FIG. 11D, a second protective material is deposited on the bottom surfaces and the sidewalls of the fifth trenches T5 by a process such as PVD, CVD, ALD, and the like. The second protective material at the bottoms of the fifth trenches T5 may be removed by a plasma etching process or reactive ion etching process to form the second protective layer 124 covering at least the sidewalls of the fifth trenches T5.

Here, the material of the second protective layer 124 includes, but is not limited to, silicon oxide.

Illustratively, the PECVD method is adopted to deposit silicon oxide on the sidewalls and bottoms of the fifth trenches T5. A plasma etching process is adopted to remove silicon oxide at the bottoms of the fifth trenches T5 by using hydrofluoric acid, to obtain silicon oxide retained on the sidewalls of the fifth trenches T5.

With reference to FIG. 12A to FIG. 12D, with the second protective layer 124 as a mask, part of the semiconductor substrate 101 is removed by etching, to enlarge the bottom of each of the fifth trenches T5, so as to form the first trench T1.

In some specific embodiments, the cross-sectional shape of the bottom of the first trench T1 includes, but is not limited to a bowl-shaped or a columnar-shaped. Here, the cross-section can be understood as a cross-section in the second direction and the third direction (Y-Z cross-section). The bottom of the first trench T1 can be understood as a concave space formed after the bottom of the fifth trench T5 is enlarged.

Here, the etching process includes a wet etching process, a dry etching process, and the like. Part of the bottom of the fifth trench is etched to increase the depth of the part of the fifth trench and increase the width of the part with increased depth of the fifth trench along the second direction to obtain the first trench. The part with increased depth of the fifth trench is located between two adjacent ones of the active pillars along the second direction.

Illustratively, in the wet etching process, with the second protective layer 124, the insulating material 104 on the top surfaces of the active pillars 103, and the insulating material 104 filled between two adjacent active pillars 103 in the first direction as a mask, an etchant is introduced into the bottoms of the fifth trenches T5, so as to selectively remove part of the semiconductor substrate 101 by the etchant. Here, the etching of part of the semiconductor substrate 101 may be isotropic etching to increase the width in the second direction and the depth in the third direction of the bottom of the fifth trench T5, thereby obtaining the first trench T1 having the bowl-shaped space.

Illustratively, in the dry etching process, with the second protective layer 124, the insulating material 104 on the top surfaces of the active pillars 103, and the insulating material 104 filled between two adjacent ones of the active pillars 103 in the first direction as a mask, an etchant is introduced into the bottoms of the fifth trenches T5, so as to selectively remove part of the semiconductor substrate 101 by the etchant. Here, the etching of part of the semiconductor substrate 101 may be a selectively removal along the Z-axis direction, to increase the depth of the bottom of the fifth trench T5 in the third direction without substantially increasing the width of the bottom of the fifth trench T5 in the second direction (it could be understood that the width of the bottom of the fifth trench T5 in the first direction remains unchanged due to the limitation of the insulating material 104), thereby obtaining the first trench T1 having a columnar-shaped space (not shown, it could be understood by replacing the first trench T1 having the bowl-shaped space in FIGS. 12A to 12D with the first trench T1 having a columnar-shaped space).

In particular, in order to clearly describe the disclosure, a first trench having the bowl-shaped space will be described here and hereafter as an example. The description of the following embodiments with respect to the first trench having the bowl-shaped space is intended only to illustrate the disclosure and is not intended to limit the protection scope of the disclosure.

Here, by taking the second protective layer as a mask, the increased depth of the first trench can be more conveniently controlled, thereby controlling the thickness of the bit line BL formed in a subsequent process, and thus increasing the process window.

With reference to FIG. 13A to FIG. 14D, S223 is performed, in which the metal layer is formed. The metal layer includes a third seed layer and a third metal layer.

With reference to FIG. 13A to FIG. 13D, the third seed layer is formed.

A conductive material is deposited on the semiconductor substrate 101 in the first trench T1 by a process such as PVD, CVD, ALD, and the like. The conductive material is used as the third seed layer 131. The third seed layer is used as a seed layer for forming the third metal layer 132 (referring to FIG. 14A to FIG. 14D) in a subsequent process.

Here, the material of the third seed layer 131 may include at least one of cobalt, copper, zinc, nickel, chromium, tin, silver, and gold.

Illustratively, a metal material, such as cobalt, is deposited on the semiconductor substrate 101 at the bottom of the first trench T1 by a PVD process.

With reference to FIG. 14A to FIG. 14D, a third metal layer is formed.

A conductive material is deposited on the third seed layer 131 by ECP to form the third metal layer 132.

Here, the total thickness of the third seed layer 131 and the third metal layer 132 is substantially equal to the depth of the bowl-shaped space.

Here, the material of the third metal layer 132 may include at least one of cobalt, copper, zinc, nickel, chromium, tin, silver, and gold.

In some embodiments, the materials of the third seed layer 131 and the third metal layer 132 may be the same or different. In some specific embodiments, the materials of the third seed layer 131 and the third metal layer 132 may be the same, and both include cobalt.

Illustratively, a metal material, such as cobalt, is deposited on the third seed layer 131 by the ECP process.

In some embodiments, the metal material is deposited on the third seed layer 131 with a second thickness by the ECP process, and then back etching is performed to control the thickness of the finally formed third metal layer. That is, the total thickness of the third seed layer 131 and the third metal layer is controlled, and thus the thickness of the bit line BL formed in the subsequent process is also controlled.

In some embodiments, the total thickness of the third seed layer 131 and the third metal layer 132 may be smaller than the depth of the bowl-shaped space (referring to FIG. 16A to FIG. 16D).

In some embodiments, the thickness of the third metal layer 132 is greater than the thickness of the third seed layer 131.

In some specific embodiments, the total thickness of the third seed layer 131 and the third metal layer 132 ranges from 20 nm to 50 nm.

With reference to FIG. 15A to FIG. 15D, in S234, a third metal compound layer is formed.

By adopting a thermal treatment, both the third seed layer 131 and the third metal layer 132 are reacted with the semiconductor substrate 101 surrounding and contacting with them to form a third metal compound layer 133. Here, the third metal compound layer 133 extends along the second direction. The third metal compound layer 133 is used a bit line BL.

Part of the third seed layer 131 and part of the third metal layer 132 are reacted with the semiconductor substrate 101 surrounding them to form the third metal compound layer 133. The remaining third seed layer, the remaining third metal layer, and the third metal compound layer 133 are used as bit lines BL.

In some specific embodiments, the material of each of the bit lines is part of the third seed layer 131, part of the third metal layer 132 and the third metal compound layer 133.

In some embodiments, the third metal compound layer 133 has a cross-sectional shape including but not limited to an arc-shaped. The cross-sectional shape of the third seed layer 131 and the third metal layer 132 between two adjacent ones of the active pillars 103 in the second direction includes, but is not limited to a bead-shaped. In practice, the third seed layer 131 and the third metal layer 132 with different cross-sectional shapes and the third metal compound layer 133 with different cross-sectional shape may be formed according to process requirements.

In some specific embodiments, the cross-sectional shape of the bit line BL includes, but is not limited to a bead-like shape. Here, the cross-section may be understood as a cross-section along the second direction and the third direction (Y-Z cross-section). Here, the bead-like shape can be understood that the material of each of the bit lines is part of the third seed layer 131, part of the third metal layer 132, and the third metal compound layer 133. The third metal compound layer 133 continuously extends in the second direction and presents an irregular "arc-shaped" body, while the third seed layer 131 and the third metal layer 132 between two adjacent active pillars 103 along the second direction can be regarded as an independent "bead-shaped" body (the cross-sectional shape is roughly "bead-shaped"). The plurality of independent "bead-shaped" bodies between each two adjacent active pillars 103 in the second direction are in close contact with the continuously extending "arc-shaped" body, and together constitute the body of the bit line BL, so that the bit line represents the "bead-like" shape in the second direction.

In some embodiments, the ion doping concentration of the third metal compound layer 133 is greater than the preset concentration. In practice, the elements for ion doping in the third metal compound layer 133 may derive from the third seed layer 131 and the third metal layer 132, and/or from the semiconductor substrate 101. When the third metal compound layer 133 is formed by the reaction of the third seed layer 131 and the third metal layer 132 with the semiconductor substrate 101, it also has elements for ion doping.

In some specific embodiments, the third metal compound layer 133 has doping ions and the type of doping may be P-type or N-type.

In some specific embodiments, ion implantation may be performed on the top surface of the semiconductor substrate 101 at the beginning of providing the semiconductor substrate or after the active pillars are formed in the semiconductor substrate. Specifically, ion implantation takes place at a location 120 nm to 200 nm below the top surface of the semiconductor substrate 101, and the thickness of ion implantation ranges from 20 nm to 80 nm. In some specific examples, the ion doping concentration ranges 1e19 atom/cm$^3$ to 1e21 atom/cm$^3$. Based on this, the third metal compound layer 133 formed subsequently also has doped ions.

In some embodiments, the maximum thickness of the third metal compound layer 133 in the third direction is substantially equal to the depth of the bowl-shaped space.

In other embodiments, the maximum thickness of the third metal compound layer 133 in the third direction is smaller than the depth of the bowl-shaped space (referring to FIG. 17A to FIG. 17D).

In some specific embodiments, the thickness of the bit line BL is in a range of 20 nm to 50 nm.

In practice, the third metal compound layer 133 may be formed by rapid thermal process.

Here, metal element in the third metal compound layers 133 includes at least one of cobalt, copper, zinc, nickel, chromium, tin, silver and gold.

Illustratively, the materials of the third seed layer 131 and the third metal layer 132 both include cobalt, and the material of the semiconductor substrate 101 includes silicon (Si). By performing the RTP, cobalt reacts with silicon to generate cobalt silicide. Due to the presence of cobalt silicide, when the third metal compound layer 133 is used as the bit line BL, ohmic contact is formed between the bit line BL (including the third metal compound layer 133) and the semiconductor substrate 101 (including the active pillars 103), which is beneficial to reducing the contact resistance.

In some embodiments, when the conductive material is filled in the first trench having the bowl-shaped space, for example, the conductive material is deposited by PVD, it is difficult to fill the conductive material in the first trench having the bowl-shaped space. The top of the first trench (the narrowest part of the bowl-shaped space, i.e., "bowl mouth") is prone to premature plugging with the deposited conductive material, which causes the inside of the first trench (the center of the bowl-shaped space) to form a void that is not filled with the conductive material. At the same time, the sidewall of the first trench, especially the sidewall of the middle part of the first trench (the widest part of the bowl-shaped space, i.e., the "bowl belly"), are basically unable to be filled with the conductive material, which is more likely to cause the inside of the first trench (the center of the bowl-shaped space) to form a void that is not filled with the conductive material.

In the embodiments of the present disclosure, when the first trench having the bowl-shaped space is filled with a conductive material, part of the conductive material can be deposited in the bottom of the first trench having a bowl-shaped space by thin film deposition, so that this part of the conductive material enables the forming of a conductive path. Then, a conductive material is grown on the basis of this part of the conductive material by electrochemical plating to fully fill the sidewall of the first trench (bowl-shaped space), the inside of the first trench (the center of the bowl-shaped space), so that finally, the conductive material filled in the first trench having the bowl-shaped space has no voids and good compactness. When the third seed layer and the third metal layer that are compact and void-free are reacted with the semiconductor substrate to generate a third metal compound layer extending in the second direction, the third metal compound layer also has characteristics of compactness and no voids. When the third metal compound layer is used as the bit line BL, the bit line BL would also have high compactness without defects such as voids.

FIG. 16A to FIG. 17E schematically show cross-section and top views of the semiconductor structure during another manufacturing process provided by embodiments of the disclosure.

With reference to FIG. 16A to FIG. 16D, a metal layer is formed. With reference to FIG. 17A to FIG. 17E, a third metal compound layer is formed.

A third metal layer is formed, which can be understood with reference to FIG. 14A to FIG. 14D. The only difference is that, here, a metal material is deposited on the third seed layer 131 with a second thickness by the ECP process, and then back etching is performed to control the thickness of the finally formed third metal layer, so that the top surface of the third metal layer is below the bottom end of the second protective layer, and the total thickness of the third seed layer 131 and the third metal layer 132 is smaller than the depth of the full bowl-shaped space. That is, the bowl-shaped space is controlled to be not fully filled with the third seed layer 131 and the third metal layer 132, and thus the thickness of the bit line BL formed in subsequent processes is also controlled to be smaller than the depth of the bowl-shaped space.

The third metal compound layer is formed, which can be understood with reference to FIG. 15A to FIG. 15D. The only difference is that here, the top surface of the third metal compound layer is below the bottom end of the second protective layer, and the maximum thickness of the third metal compound layer 133 in the third direction is smaller than the depth of the bowl-shaped space. That is, the bowl-shaped space is controlled to be not fully filled with the third metal compound layer 133, and thus the thickness of the bit line BL formed in subsequent processes is controlled to be smaller than the depth of the bowl-shaped space.

In the embodiment of the disclosure, the thickness of the bit line BL (including the third metal compound layer 133) can be controlled by controlling the total thickness of the formed third seed layer and third metal layer. By taking the second protective layer as a mask, the increased depth of the first trench can be more conveniently controlled; and by taking the second protective layer as a mask, the total thickness of the third seed layer and the third metal layer that are finally formed by the ECP process and the back-etching at part with increased depth of the first trench, can be more conveniently controlled, thereby controlling the thickness of the bit line BL (including the third metal compound layer 133) formed in subsequent processes, and thus increasing the process window.

Third Solution

Yet another method for manufacturing a semiconductor structure provided by embodiments of the disclosure includes the following operations.

After the first metal compound layer is formed, the method further includes the following operations.

A plurality of active pillars arranged in an array along the first direction and the second direction are formed in the semiconductor substrate, and a third trench is formed between two adjacent ones of the active pillars along the second direction.

A second seed layer is formed in the third trench.

A second metal layer is formed on the second seed layer by electroplating.

A thermal treatment is performed to allow part of the second seed layer and part of the second metal layer to react with the semiconductor substrate surrounding the part of the second seed layer and part of the second metal layer, so as to form a second metal compound layer. The remaining second seed layer, the remaining second metal layer, the second metal compound layer, and the first metal compound layer are used as bit lines extending in the second direction.

That is, the above method for manufacturing a semiconductor structure includes the following operations.

i. The first metal compound layer is formed. The specific method for forming the first metal compound layer can be understood with reference to the above operations described in S212 to S214, and FIG. 3A to FIG. 7D mentioned above, which will not be repeated here.

ii. After the first metal compound layers are formed, the first seed layer and the first metal layer in the first trench are removed such that a plurality of the first metal compound layers are arranged at intervals along the first direction and electrically isolated from each other. An insulating material is filled in the first trench after removing the first seed layer and the first metal layer in the first trenches. Specifically, with reference to FIG. 7A to FIG. 7D mentioned above, after S214, an insulating material (not shown in FIG. 7A to FIG. 7D) is filled in the first trench T1, so that a plurality of the first metal compound layers extending in the second direction are arranged at intervals along the first direction and electrically isolated from each other. Specific process details will not be repeated here.

iii. The second metal compound layer is formed. It should be noted that, the second metal compound layer here is a bit line formed by the same electroplating in combination with a thermal treatment in the trench extending along the extension direction of the word line. The second metal compound layer is substantially similar to the aforementioned third metal compound layer. The specific method for forming the third metal compound layer can refer to the above operations S221 to S224, and could be understood with reference to FIG. 9A to FIG. 12D. Here, the third trench can be understood with reference to the first trench T1 shown in FIG. 9A to FIG. 12D. The second seed layer, the second metal layer and the second metal compound layer can be understood with reference to the third seed layer 131, the third metal layer 132 and the third metal compound layer 133 shown in FIG. 9A to FIG. 12D. Specific details will not be repeated. It can be understood that forming the first metal compound layer in the first trench corresponds to the alloying of the active pillar on both sidewalls of the active pillar in the first direction; forming of the second metal compound layer in the third trench corresponds to the alloying of the active pillar on both sidewalls of the active pillar in the second direction. In the embodiments of the disclosure, the first metal compound layer is formed in the first trench and the second metal compound layer is also formed in the third trench, which corresponds to the alloying of the active pillar on all sidewalls (sidewalls in four directions) of the active pillar, so that the conductive material in good contact with the semiconductor substrate reacts more fully with the semiconductor substrate, and the formed metal compound layer is more denser and has no voids, thereby more facilitating to the formation of ohmic contact between the metal compound layer and the active pillar.

According to another aspect of the disclosure, a semiconductor structure is further provided by embodiments of the disclosure. The semiconductor structure includes a plurality of active pillars and a plurality of conductor lines.

Each of the plurality of conductor lines includes a plurality of metal layers located in a gap between two adjacent ones of the active pillars and a metal compound layer partially surrounding the plurality of active pillars.

In some embodiments, the plurality of active pillars are arranged in an array along a first direction and a second direction. The first direction and the second direction are intersected with each other and perpendicular to an extension direction of the active pillars.

Each of the conductor lines includes a plurality of third seed layers located in the gap between adjacent active pillars along the second direction, third metal layers located on the third seed layers, and a third metal compound layer partially surrounding the third seed layers and the third metal layers. Each of the conductor lines is electrically connected with one of the active pillars in a row extending along the second direction of active pillars. The conductor lines are used as bit lines.

In some embodiments, each of the bit lines further includes a first metal layer extending along the second direction.

In some embodiments, a cross-sectional shape of each of the first metal layers includes a strip-like shape.

In some embodiments, a cross-sectional shape of the third metal compound layer includes a bead-like shape.

In some embodiments, the ion doping concentration in the metal compound layer is greater than a preset concentration. Here, the preset concentration may range from 1e19 atom/$cm^3$ to 1e21 atom/$cm^3$.

In some embodiments, the semiconductor structure further includes a plurality of word lines.

The plurality of word lines are located on the bit lines, and each of the word lines is electrically connected with one of the active pillars in a row extending along the first direction of active pillar.

In some embodiments, metal element in the metal compound layers includes at least one of cobalt, copper, zinc, nickel, chromium, tin, silver and gold.

Figure 18:
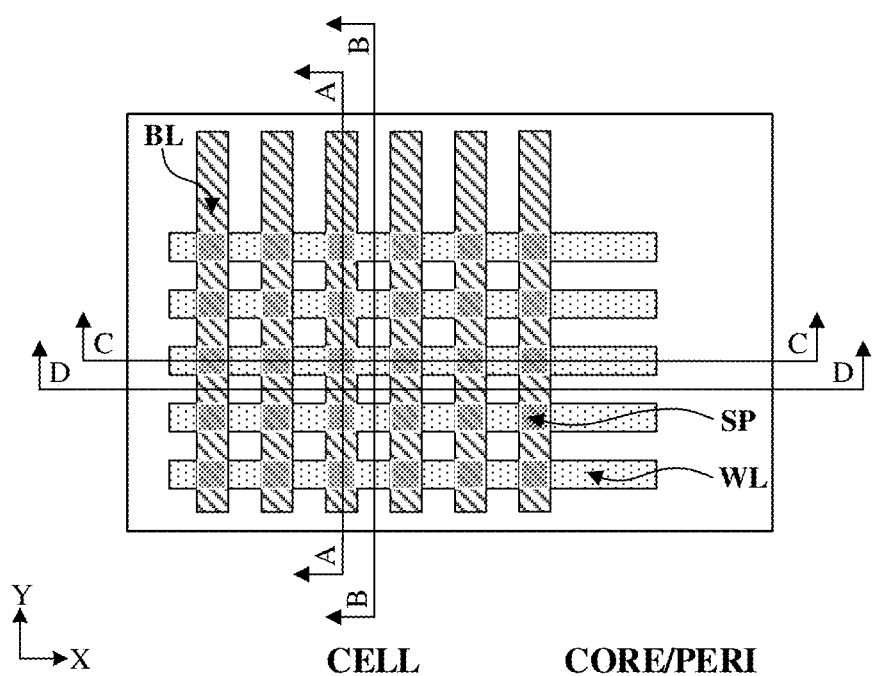
FIG. 18 schematically shows a plane-view of a structure of a memory provided by embodiments of the disclosure.

FIG. 18 is a plan-view schematic diagram of a structure of a memory provided by an embodiment of the disclosure. FIG. 18 may be understood as the memory to be formed on the basis of FIG. 15A to FIG. 15D or FIG. 17A to FIG. 17E. The memory includes transistor structures, word lines, and bit lines. In order to maintain consistency with the above operations, an arrangement of the active pillars (SP) in FIG. 18 may be understood with reference to the arrangement of the active pillars 103 shown in FIG. 15A to FIG. 15D or FIG. 17A to FIG. 17E. Cross-sectional directions A-A, B-B, C-C, D-D in FIG. 18 may also be understood with reference to cross-sectional positions in FIG. 15A to FIG. 15D or FIG. 17A to FIG. 17E. Cross-section A-A in FIG. 18 represents a plane along a Y-Z plane and passing through a row of the transistors (including the active pillars SP) arranged in the second direction. Cross-section B-B in FIG. 18 represents a plane along a Y-Z plane and not passing through a row of the transistors (including the active pillars SP) arranged in the second direction. Cross-section C-C in FIG. 18 represents a plane along an X-Z plane and passing through a row of the transistors (including the active pillars SP) arranged in the first direction. Cross-section D-D in FIG. 18 represents a plane along an X-Z plane and not passing through a row of the transistors (including the active pillars SP) arranged in the first direction.

It should be noted that, FIG. 18 shows an array cell region (CELL) and a core region/peripheral circuit region (CORE/PERI) in the memory. The array cell region includes active pillars SP, word lines WL, and bit lines BL. The active pillars SP, the word lines WL, and the bit lines BL are shown by being projected in an X-Y plane. The extension direction of the word lines WL and the extension direction of the bit lines BL are perpendicular to each other. The word lines WL extend in the first direction and are arranged in the second direction. The word lines BL extend in the second direction and are arranged in the first direction. A channel structure (not shown) in each of active pillars SP, a source and a drain (not shown) formed at both ends in the extension direction of the active pillars SP, and a gate structure (not shown) surrounding the sidewall of the active pillar SP constitute a transistor of the memory. It can be understood that, the word lines WL surround the gate structures (not shown) of the sidewalls of the active pillars SP. Each of the word lines electrically connects the gates of a row of the transistors arranged in the first direction.

In some embodiments, the semiconductor structure further includes a plurality of word lines.

The plurality of word lines are located on the bit lines, and each of the word lines is electrically connected to each of the active pillars in a row extending along the second direction of active pillars.

It should be noted that, each of the word lines is electrically connected with the gate of one of the active pillars in a row extending along the second direction of active pillars. Here, in different types of transistors, gates have different shapes. Illustratively, with reference to FIG. 18, in a cylindrical gate transistor, a gate is formed in a cylindrical form on one side of the channel region. In a semi-surround gate transistor, a gate semi-surrounds the channel region. In a Gate All Around (GAA) transistor, a gate completely surrounds the channel region.

A type of the transistor in embodiments of the disclosure may include the above-mentioned various types, but are not limited thereto. Preferably, with reference to FIG. 18, the type of the transistor is a gate-all-around transistor.

It should be noted that, the gate structure herein includes a gate (G) and a gate oxide layer. The gate oxide layer is located between the gate and a channel region, such that the channel region and the gate are electrically isolated, and a hot carrier effect of the transistors is reduced.

Here, the material of the gate may include metal and/or polysilicon (Poly) or the like. The material of the gate oxide layer may include, but is not limited to silicon oxide.

In some embodiments, a method for forming the gate includes, but is not limited to ECP, PVD, CVD, ALD, or the like. The method for forming the gate oxide layer includes, but is not limited to, in-situ oxidation.

The source and the drain are respectively formed at two opposite ends of the active pillar.

In some specific embodiments, a method for forming the source and drain includes but is not limited to ion implantation process and a diffusion process.

It should be noted that, the source and the drain at the opposite ends of the active pillar are interchangeable. The actual situation may be selected and set according to the actual requirements.

It could be understood that, the memory in the above embodiments is of a Transistor on Capacitor structure, and the structure further includes a plurality of memory cells located on the transistors and in electrical contact with the tops of the active pillars.

It could be understood that, the bit line BL is used to perform a read or write operation on a transistor when the transistor is turned on.

In the embodiments of the disclosure, part of the conductive material is deposited as a seed layer at the bottom of the trench by thin film deposition, and then the conductive material is continuously grown on the basis of the seed layer by electrochemical plating to form a conductive material that fully fills the sidewalls of the trench and the inside of the trench with no voids, good compactness and good contact with the semiconductor substrate. When the conductive material with no voids, good compactness and good contact with the semiconductor substrate reacts with the semiconductor substrate, the formed metal compound layer also has the characteristics of compactness, no voids and continuously extending. When the metal compound layer is used as the bit line, the bit line also has high compactness without defects such as voids, and can form ohmic contact with the active pillars.

The semiconductor structure provided by the embodiments of the disclosure is similar to the semiconductor structure formed by the method for manufacturing the semiconductor structure in the above-mentioned embodiments. Technical features which are not described in detail in the embodiments of the disclosure may be understood by referring to the above-mentioned embodiments, and will not be repeated here.

According to yet another aspect of the disclosure, a memory is provided. The memory includes one or more semiconductor structure as described in any of the above-described embodiments of the disclosure.

Based on the above, in the embodiments of the disclosure, the bit lines are arranged below the transistors to form buried bit lines (BBL), so as to reduce the resistance and reduce the process difficulty, and to better match with the circuit design scheme of the memory.

The semiconductor structure involved in an embodiment of the disclosure is at least a part of a device structure that will be used for subsequent processes to form a final device structure. Here, the final device may include a memory including but not limited to dynamic random access memory which is described only as an example.

It should be noted however that the description of the embodiments with respect to dynamic random access memory is intended only to illustrate the disclosure and is not intended to limit the protection scope of the disclosure.

The invention claimed is:
1. A method for manufacturing a semiconductor structure, comprising:
   providing a semiconductor substrate;
   forming a first trench in the semiconductor substrate;
   forming a metal layer in the first trench by electroplating; and
   performing a thermal treatment to allow the metal layer to react with the semiconductor substrate surrounding and in contact with the metal layer, so as to form a metal compound layer, wherein the metal compound layer at least is used as conductor lines;
   wherein the formation of the first trench comprises:
   forming a plurality of first trenches arranged at intervals along a first direction in the semiconductor substrate;
   the formation of the metal layer comprises:
   forming a first seed layer in the first trench; and
   forming a first metal layer on the first seed layer by electroplating; wherein the first seed layer together with the first metal layer constitutes the metal layer;
   the formation of the metal compound layer comprises:
   performing a thermal treatment such that the semiconductor substrate surrounding the first seed layer and the first metal layer is completely reacted into a first metal compound layer; wherein the first metal compound layer extends in a second direction, and is used as a bit line; the first direction and the second direction are intersected with each other and perpendicular to a direction of a thickness of the semiconductor substrate;
wherein the formation of the plurality of first trenches arranged at intervals along the first direction in the semiconductor substrate comprises:
forming a plurality of second trenches arranged at intervals along the first direction in the semiconductor substrate; and
filling the second trenches with an insulating material partially to form the first trenches.

2. The method according to claim 1, further comprising:
forming a first protective layer covering at least a sidewalls of the first trench;
removing part of the insulating material to expose part of the sidewall of the first trench; and
forming the first seed layer and the first metal layer on the remaining insulating material in the first trench, and a top surface of the first metal layer is substantially flush with a bottom end of the first protective layer.

3. The method according to claim 1, wherein
after the first metal compound layer is formed, the method further comprises:
forming a plurality of active pillars arranged in an array along the first direction and the second direction in the semiconductor substrate, and forming a third trench between two adjacent active pillars along the second direction;
forming a second seed layer in the third trench;
forming a second metal layer on the second seed layer by electroplating; and
performing a thermal treatment to allow part of the second seed layer and part of the second metal layer to react with the semiconductor substrate surrounding the part of the second seed layer and the part of the second metal layer, so as to form a second metal compound layer; wherein the remaining second seed layer, the remaining second metal layer, the second metal compound layer, and the first metal compound layer are used as bit lines extending in the second direction.

4. The method according to claim 1, wherein
the formation of the first trench comprises:
forming a plurality of active pillars arranged in an array along a first direction and a second direction in the semiconductor substrate, and forming the first trench between two adjacent active pillars along the second direction; wherein the first direction and the second direction are intersected with each other and perpendicular to a direction of a thickness of the semiconductor substrate;
the formation of the metal layer comprises:
forming a third seed layer in a bottom of the first trench;
forming a third metal layer on the third seed layer by electroplating; wherein the third seed layer together with the third metal layer constitutes the metal layer;
the formation of the metal compound layer comprises:
performing a thermal treatment to allow part of the third seed layer and part of the third metal layer to react with the semiconductor substrate surrounding the part of the third seed layer and the part of the third metal layer, so as to form a third metal compound layer; wherein the remaining third seed layer, the remaining third metal layer, and the third metal compound layer are used as bit lines extending in the second direction.

5. The method according to claim 4, wherein
the formation of the first trench between two adjacent active pillars along the second direction comprises:
forming a plurality of fourth trenches arranged at intervals along the first direction in the semiconductor substrate, and filling the fourth trenches with an insulating material;
forming a plurality of fifth trenches arranged at intervals along the second direction in the semiconductor substrate, a depth of the fifth trenches being different from a depth of the fourth trenches; and
etching part of a bottom of the fifth trench to increase a depth of the part of the fifth trench and increase a width of the part with increased depth of the fifth trench along the second direction, so as to obtain the first trench; wherein the part with increased depth of the fifth trench is located between two adjacent active pillars along the second direction.

6. The method according to claim 5, further comprising:
forming a second protective layer covering at least part of a sidewall of the first trench; wherein a top surface of the third metal layer is lower than or is substantially flush with a bottom end of the second protective layer.

* * * * *